(12) United States Patent
Takahashi et al.

(10) Patent No.: US 6,710,437 B2
(45) Date of Patent: Mar. 23, 2004

(54) SEMICONDUCTOR DEVICE HAVING A CHIP-SIZE PACKAGE

(75) Inventors: Yoshikazu Takahashi, Tokyo (JP); Masami Suzuki, Tokyo (JP); Masaru Kimura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/300,883

(22) Filed: Nov. 21, 2002

(65) Prior Publication Data

US 2003/0109078 A1 Jun. 12, 2003

Related U.S. Application Data

(62) Division of application No. 09/663,616, filed on Sep. 18, 2000, now Pat. No. 6,589,817.

(30) Foreign Application Priority Data

Dec. 3, 1996 (JP) .............................. 8-322847
May 20, 1997 (JP) .............................. 9-129931

(51) Int. Cl.⁷ .............................................. H01L 23/48
(52) U.S. Cl. ...................................................... 257/690
(58) Field of Search ................................. 257/668, 690, 257/692, 701, 737, 738, 778; 174/52.1, 52.4, 255, 260

(56) References Cited

U.S. PATENT DOCUMENTS 4,259,436 A * 3/1981 Tabuchi et al. ............. 430/314
5,196,268 A * 3/1993 Fritz ........................... 428/458
5,801,434 A * 9/1998 Sugahara ..................... 257/668
5,825,081 A * 10/1998 Hosomi et al. .............. 257/668
5,849,608 A * 12/1998 Abe ............................ 438/123
5,858,815 A * 1/1999 Heo et al. .................... 438/112
6,060,771 A * 5/2000 Tomikawa et al. .......... 257/676
6,274,822 B1 * 8/2001 Light et al. ................. 174/260

FOREIGN PATENT DOCUMENTS

JP         6-295935        10/1994
JP         8-31868         2/1996

* cited by examiner

*Primary Examiner*—Kamand Cuneo
*Assistant Examiner*—Scott B. Geyer
(74) *Attorney, Agent, or Firm*—Venable; James R. Burdett

(57) ABSTRACT

A semiconductor device includes a semiconductor chip having an edge and having a surface with a plurality of electrodes. A film is mounted over the surface of the semiconductor chip, the film has first and second surfaces and has a device hole. The first surface of the film is oriented toward the surface of the semiconductor chip and so that the device hole exposes the electrodes of the semiconductor chip. Connecting conductors are disposed at the first surface of the film and extend into the device hole to the electrodes. Electrode pad holes are provided in the film, at positions between the device hole and the edge of the semiconductor chip to expose the conductors.

12 Claims, 20 Drawing Sheets

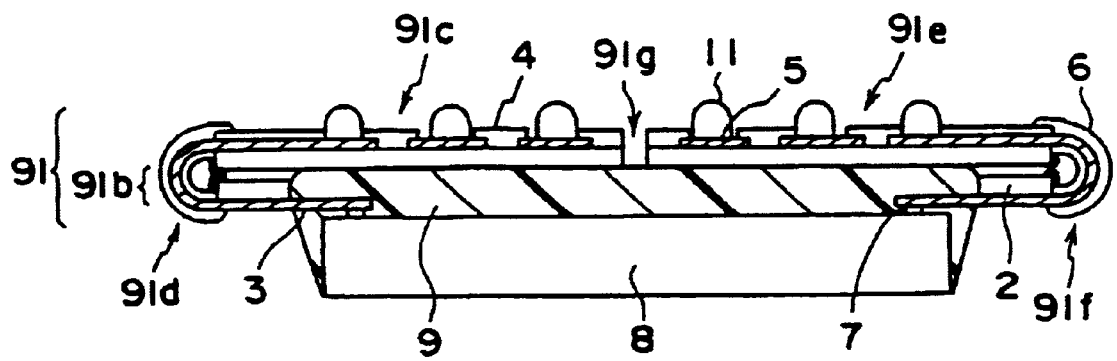

SEMICONDUCTOR DEVICE HAVING A CHIP-SIZE PACKAGE

This application is a divisional of U.S. patent application Ser. No. 09/663,616, filed Sep. 18, 2000, now U.S. Pat. No. 6,589,817.

BACKGROUND OF THE INVENTION

1. Field of the Invention

The present invention relates to a semiconductor device having a package which has substantially the same size as that of a semiconductor chip and is particularly suitable for a multiple-output semiconductor chip, as well as a method for manufacturing the same and a method for mounting the same.

2. Description of the Related Art

Conventionally, packages having substantially the same size as semiconductor chips of this type are called a chip-size package, a μ-BGA, a chip-scale package (CSP), and the like, and various types of such packages have been developed. FIG. 24 is a fragmentary perspective view of a semiconductor device having a package of a conventional molded type. This semiconductor device is manufactured by forming bumps 242 on electrode pads of an LSI chip 241, then by resin-encapsulating the LSI chip 241 with a mold resin 243 having substantially the same size as that of the LSI by using a transfer mold, and finally by depositing solder balls 244 on external electrodes.

FIG. 25 shows a cross-sectional view of a semiconductor device having a conventional film (film carrier tape) type. This semiconductor device is manufactured as follows. The surface of an LSI chip 251 is coated with an elastic adhesive (elastomer) 252, a polyimide film 255 on which inner leads 253 and external connection pads 254 have been formed is secured to the surface of the LSI chip 251 by means of the elastic adhesive 252, the inner leads 253 are bonded to the chip electrode pads of the LSI chip 251, and solder balls 256 are deposited on the external connection pads 254.

In addition, FIG. 26 is a cross-sectional view of a semiconductor device having a package of a conventional flip chip bonding type. This semiconductor device is manufactured by forming bumps 262 on the surface of an LSI chip 261, then by effecting face-down bonding the LSI chip 261 on a substrate 263 formed of a ceramic or an organic material, and then by encapsulating the chip by using an encapsulating resin 264. Solder balls 265 are deposited on the reverse surface of the substrate 263. If the package of any one of the types shown in FIGS. 24 to 26 is used, it is possible to manufacture a semiconductor device having a package of substantially the same size as that of the LSI.

However, with the semiconductor device shown in FIG. 24, an exclusive-use transfer mold is required, which has been a factor hampering the effort in lowering the cost of the semiconductor devices.

In addition, with the semiconductor device shown in FIG. 25, since a special elastic adhesive is used between the LSI chip and the tape, the contamination of or the damage to the surface of the LSI chip can occur, possibly deteriorating the reliability. In addition, when the LSI chip and the inner leads are connected, a single bonding method in which the leads are bonded one at a time is used. As a result, in multiple-output packages, the bonding time becomes prolonged, and has constituted a factor hampering the effort in lowering the cost of the semiconductor devices.

Furthermore, with the semiconductor device shown in FIG. 26, the substrate is multilayered in the multiple-output package and is expensive, and in the case of an LSI chip having a large size, the difference in the coefficient of thermal expansion between the substrate and the LSI chip in some cases constitutes a problem in the reliability.

SUMMARY OF THE INVENTION

In view of the above-described circumstances, it is an object of the present invention to provide a low-cost, highly reliable semiconductor device suitable for use in a case where a multiple-output LSI chip, as well as a method for manufacturing the same and a method for mounting the same, thereby overcoming the above-described drawbacks of the conventional art.

To this end, in accordance with a first aspect of the present invention, there is provided a semiconductor device comprising a package film including: a device-mounting film portion on which a semiconductor chip is mounted; an external-connection film portion arranged on the device-mounting film portion and having an external electrode pad formed thereon; a bending portion provided between an end portion of the device-mounting film portion and an end portion of the external-connection film portion; and an inner lead for electrically connecting an electrode pad of the semiconductor chip and the external electrode pad via the bending portion.

In accordance with a second aspect of the present invention, there is provided a semiconductor device comprising a package film including: a device-mounting film portion on which a semiconductor chip is mounted such that the device-mounting film portion faces an obverse surface of the semiconductor chip; an external-connection film portion arranged on a reverse surface of the semiconductor chip and having an external electrode pad formed thereon; a bending portion provided between an end portion of the device-mounting film portion and an end portion of the external-connection film portion; and an inner lead for electrically connecting an electrode pad of the semiconductor chip and the external electrode pad via the bending portion.

In accordance with a third aspect of the present invention, there is provided a semiconductor device comprising a package film on which a semiconductor chip having an electrode pad arranged in a region along a central portion of the chip or a center line of the chip is mounted, wherein the package film includes: a device hole formed in a region along a central portion thereof or a center line thereof in correspondence with the region where the electrode pad of the semiconductor chip is formed; an external electrode pad formed in a region other than the region where the device hole is formed; and an inner lead connecting the electrode pad of the semiconductor chip and the external electrode pad.

In accordance with a fourth aspect of the present invention, there is provided a semiconductor device comprising a package film on which a semiconductor chip having an electrode pad arranged in a peripheral portion of the chip is mounted, wherein the package film includes: a device hole formed in a peripheral portion thereof in correspondence with the region where the electrode pad of the semiconductor chip is formed; an external electrode pad formed in a region other than the region where the device hole is formed; and an inner lead connecting the electrode pad of the semiconductor chip and the external electrode pad, wherein a space between the package film and a surface of the semiconductor chip is fixed by an encapsulating resin.

In accordance with a fifth aspect of the present invention, there is provided a semiconductor device comprising a package film including: a device-mounting film portion on which a semiconductor chip having an electrode pad arranged in a predetermined region is mounted such that the device-mounting film portion faces an obverse surface of the semiconductor chip; an external-connection film portion arranged on a reverse surface of the semiconductor chip and having an external electrode pad formed thereon; a bending portion provided between an end portion of the device-mounting film portion and an end portion of the external-connection film portion; and an inner lead, wherein the device-mounting film portion has a device hole formed in a predetermined region in correspondence with a region where an electrode pad of the semiconductor chip is formed and an external electrode pad formed in a region other than the region where the device hole is formed, and the inner lead electrically connects the electrode pad of the semiconductor chip and the external electrode pad of the device-mounting film portion, and electrically connects the electrode pad of the semiconductor chip and the external-connection film portion via the bending portion.

In accordance with a sixth aspect of the present invention, there is provided a method for manufacturing a semiconductor device, comprising the steps of: preparing a package film having a planar configuration whose region is divided into a device-mounting film portion having a device hole forming therein, an external-connection film portion, and a bent portion located between the device-mounting film portion and the external-connection film portion, an external electrode pad being formed on the external-connection film portion on a first surface side of the package film, an inner lead being formed in such a manner as to lead from the device hole to the external electrode pad via the bending portion; mounting a semiconductor chip on the device-mounting film portion on the first surface side by bonding the inner lead to an electrode pad of the semiconductor chip in a region where the device hole is formed; and bending the external-connection film portion at the bending portion 180° toward a second surface side of the package film and fixing the same.

In accordance with a seventh aspect of the present invention, there is provided a method for manufacturing a semiconductor device, comprising the steps of: preparing a package film having a planar configuration whose region is divided into a device-mounting film portion having a device hole forming therein, an external-connection film portion, and a bent portion located between the device-mounting film portion and the external-connection film portion, an external electrode pad being formed on the external-connection film portion on a first surface side of the package film, an inner lead being formed in such a manner as to lead from the device hole to the external electrode pad via the bending portion; mounting a semiconductor chip on the device-mounting film portion on a second surface side of the package film by bonding the inner lead to an electrode pad on an obverse surface of the semiconductor chip in a region where the device hole is formed; and bending the external-connection film portion at the bending portion 180° toward a reverse surface side of the semiconductor chip and fixing the same to the reverse surface.

In accordance with an eighth aspect of the present invention, there is provided a method for manufacturing a semiconductor device, comprising the steps of: preparing a semiconductor chip having an electrode pad arranged in a region along a central portion of the chip or a center line of the chip, as well as a package film having a device hole formed in a region along a central portion thereof or a center line thereof in correspondence with the region where the electrode pad of the semiconductor chip is formed, an external electrode pad being formed on an external connection surface side of the package film in a region other than the region where the device hole is formed, an inner lead being formed in such a manner as to lead from the device hole to the external electrode; and mounting the semiconductor chip on a device mounting surface side of the package film by bonding the inner lead to the electrode pad of the semiconductor chip in the region where the device hole is formed.

In accordance with a ninth aspect of the present invention, there is provided a method for manufacturing a semiconductor device, comprising the steps of: preparing a semiconductor chip having an electrode pad arranged in a peripheral portion of the chip, as well as a package film having a device hole formed in a peripheral portion thereof in correspondence with the region where the electrode pad of the semiconductor chip is formed, an external electrode pad being formed on an external connection surface side of the package film in a region other than the region where the device hole is formed, an inner lead being formed in such a manner as to lead from the device hole to the external electrode; and mounting the semiconductor chip on a device mounting surface side of the package film by bonding the inner lead to the electrode pad of the semiconductor chip in the region where the device hole is formed, and by allowing an encapsulating resin to flow into a space between the package film and an obverse surface of the semiconductor chip.

In accordance with a 10th aspect of the present invention, there is provided a method for manufacturing a semiconductor device, comprising the steps of: preparing a semiconductor chip having electrode pads arranged in a predetermined region thereof, as well as a package film having a planar configuration whose region is divided into a device-mounting film portion having a device hole forming in a determined region thereof, an external-connection film portion, and a bent portion located between the device-mounting film portion and the external-connection film portion, external electrode pads being formed on the external-connection film portion on a first surface side of the package film and in a region other than the region where the device hole is formed in the device-mounting film portion on the first surface side, inner leads being formed in such a manner as to lead from the device hole to respective the external electrode pads; mounting the semiconductor chip on the device-mounting film portion on a second surface side of the package film by bonding the inner leads to the electrode pads on an obverse surface of the semiconductor chip in a region where the device hole is formed; and bending the external-connection film portion at the bending portion 180° toward a reverse surface side of the semiconductor chip and fixing the same to the reverse surface.

In accordance with an 11th aspect of the present invention, there is provided a method for mounting a semiconductor device on a mother board in close contact therewith, comprising the steps of: depositing solder balls on electrode pads of the mother board; and placing the semiconductor device on the mother board and melting the solder balls so as to electrically connect the electrode pads of the mother board and the external electrode pads of the semiconductor device In accordance with a 12th aspect of the present invention, there is provided a method for mounting a semiconductor device in which a plurality of superposed semiconductor devices are mounted on a mother board, comprising the step of: causing the external electrode pads formed on one of the external-connection film portion and the device-mounting film portion of a first semiconductor device to be superposed on the electrode pads of the mother board, and causing the external electrode pads formed on one of the external-connection film portion and the device-mounting film portion of a second semiconductor device to be superposed on the external electrode pads formed on another film portion of the first semiconductor device, so as to electrically connect the superposed electrodes.

The above and other objects, features and advantages of the present invention will become more apparent from the following detailed description of the invention when read in conjunction with the accompanying drawings.

BRIEF DESCRIPTION OF THE DRAWINGS

FIG. 10 is a cross-sectional structural diagram of a semiconductor device in accordance with a 10th embodiment of the present invention;

FIG. 11 is a cross-sectional structural diagram of a semiconductor device in accordance with an 11th embodiment of the present invention;

DESCRIPTION OF THE PREFERRED EMBODIMENTS

Figure 1A:
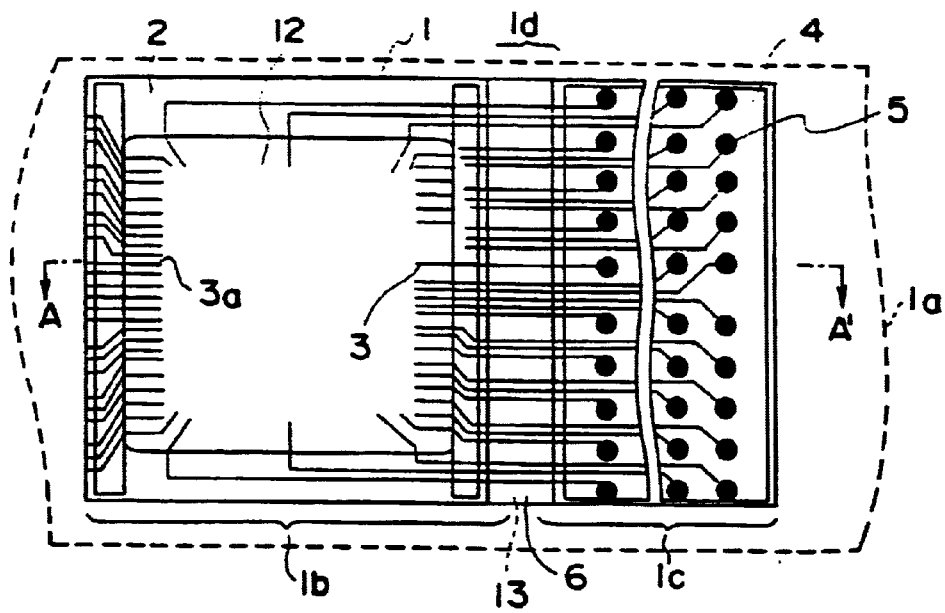
FIG. 1A is a top view, taken from an inner-lead forming surface (first surface) side, of a package film used in a semiconductor device in accordance with a first embodiment of the present invention.
Figure 1B:
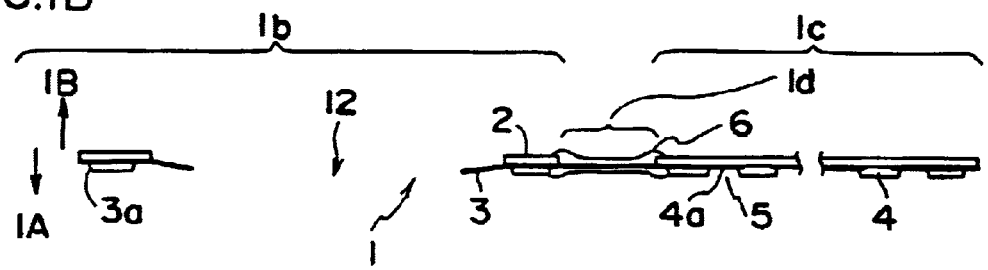
FIG. 1B is a cross-sectional view taken along line A–A' in FIG. 1A.
Figure 1C:
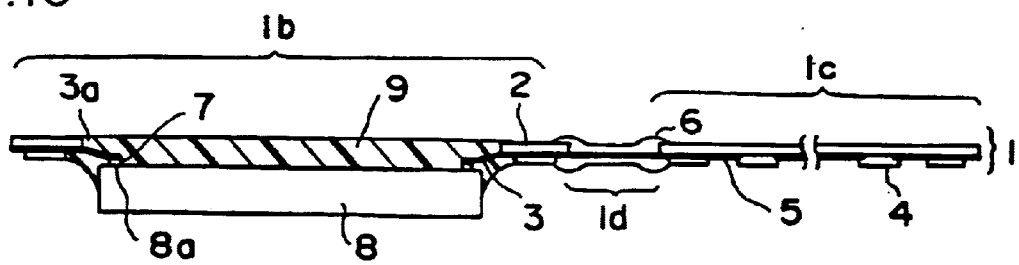
FIG. 1C is a cross-sectional structural diagram in the course of manufacture of the semiconductor device in accordance with the first embodiment of the present invention.
Figure 1D:
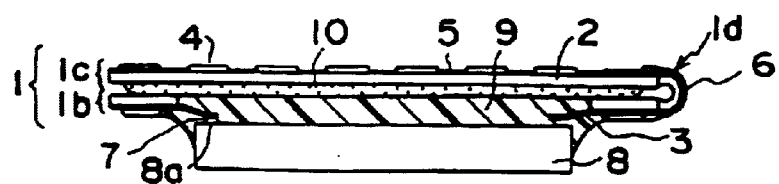
FIG. 1D is a cross-sectional structural diagram in the course of manufacture of the semiconductor device in accordance with the first embodiment of the present invention.
Figure 1E:
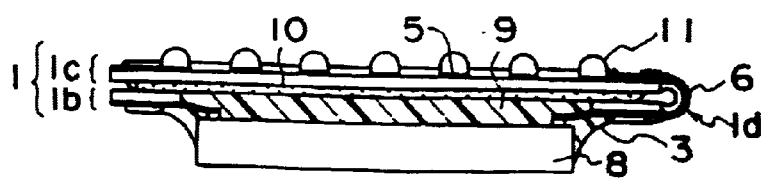
FIG. 1E is a cross-sectional structural diagram of the semiconductor device in accordance with the first embodiment of the present invention.

FIGS. 1A to 1E are diagrams illustrating the structure of a semiconductor device and a process for manufacturing the same in accordance with a first embodiment of the present invention. FIG. 1A is a top view, taken from an inner-lead forming surface (first surface) 1A side, of a package film 1 used in this semiconductor device. FIG. 1B is a cross-sectional view taken along line A–A' in FIG. 1A. FIGS. 1C and 1D are cross-sectional structural diagrams in the course of manufacture of the semiconductor device in accordance with the first embodiment. FIG. 1E is a cross-sectional structural diagram of the semiconductor device in accordance with the first embodiment.

First, the package film 1 is fabricated, as shown in FIGS. 1A and 1B. That is, inner leads 3 are formed on a polyimide base resin 2 in which a device hole 12 has been formed in a predetermined area for a device-mounting film portion by press punching and in which a bending hole 13 has been formed in a predetermined area for a bent portion. Here, the inner leads 3 are formed, for instance, by attaching a copper foil to the surface of the base resin 2, subjecting the copper foil to patterning by photolithographic etching, and then soldering or tin-plating the etched copper foil. Reference numeral 3a in the drawings denote dummy inner leads.

Next, an insulating resin 4 is coated on the base thus prepared, electrode pad holes 4a are formed in the insulating resin 4 by photolithographic etching to allow the inner leads 3 to be exposed, thereby forming external electrode pads 5. Incidentally, the external electrode pads 5 may be formed b selecting coating (patterning) the insulating resin 4 by a printing method. In addition, it is preferable to coat a polyimide-based elastic resin 6 on one surface or both surfaces of the inner leads 3 in a bending portion 1d for the purpose of preventing the deterioration of the strength of the inner leads 3 or disconnection thereof. Thus the package film 1 is fabricated. It should be noted that in a case where the tape automated bonding (TAB) manufacturing technology, a plurality of package films 1 are fabricated and supplied onto a film carrier tape 1a.

Next, as shown in FIG. 1C, the inner-lead forming surface 1A (first surface) of the package film 1 is made to oppose the surface of an LSI chip 8, and the LSI chip 8 is mounted on a device-mounting film portion 1b of the package film 1. That is, in the device-mounting film portion 1b of the package film 1, the inner leads 3 and the dummy inner leads 3a are collectively bonded by thermo-compression bonding to chip electrode pads 8a of the LSI chip 8 on which gold-plated bumps 7 have been formed. Then, an encapsulating resin 9, such as an epoxy resin, is allowed to flow into a space formed by the device-mounting film portion 1b and the surface of the LSI chip 8, thereby fixing and mounting the LSI chip 8 with respect to the device-mounting film portion 1b. Here, the dummy inner leads 3a have the function of preventing the inner leads 3 from becoming disconnected or the bonded portions from becoming peeled off from the time the inner leads 3 are bonded until the LSI chip 8 is fixed. Incidentally, in the case where the TAB technology is used, the package films 1 are separated from the film carrier tape 1a by punching after completion of the mounting of the LSI chip 8. Since the inner leads are collectively bonded to the electrode pads of the semiconductor chip in the above-described manner, the number of processing steps can be reduced, and the manufacturing cost can be lowered, so that it possible to lower the cost of the packages.

Next, as shown in FIG. 1D, an external-connection film portion 1c of the package film 1 is bent 180° at the bending portion 1d toward a base-resin surface 1B (second surface), and is secured to the surface of the encapsulating film 9 in the device-mounting film portion 1b by means of an adhesive 10. Here, a point of bending is set, for example, to a position about 1 mm spaced apart from an outer side surface of the LSI chip 8. Finally, as shown in FIG. 1E, solder balls 11 are deposited on the external electrode pads 5.

Thus, in accordance with the first embodiment, the inner leads 3 (and the dummy inner leads 3a) formed in such a manner as to project into the device hole 12 of the device-mounting film portion 1b are collectively bonded to the chip electrode pads 8a of the LSI chip 8 to mount the LSI chip 8 on the device-mounting film portion 1b, the external-connection film portion 1c is bent 180° at the bending portion 1d (abut 1 mm spaced apart from the outer side of the LSI chip 8) and is secured to the device-mounting film portion 1b. As a result, since a special elastic adhesive is not used, it is possible to improve the reliability. In addition, since the inner leads are collectively bonded to the LSI chip without using an exclusive-use transfer mold, it is possible to lower the manufacturing cost, so that it is possible to lower the cost of the packages.

It should be noted that a structure may be adopted in which, as shown in FIG. 1D, the solder balls 11 are not deposited on the external electrode pads 5 without executing the step shown in FIG. 1E. When this chip-size package is mounted on a mother board, satisfactory connections are made possible by supplying solder balls to the mother board side. A printing technique, for example, is used in supplying the solder balls to the mother board. As the solder balls are thus supplied to the mother board side, it becomes possible to mount a plurality of packages simultaneously. Hence, it is possible to reduce the number of steps in the mounting of packages onto the mother board. In addition, in the process for manufacturing the packages, the step for depositing the solder balls on the external electrode pads is not required, and the number of processing steps can be reduced, thereby making it possible to further lower the cost of the semiconductor device.

Figure 2A:
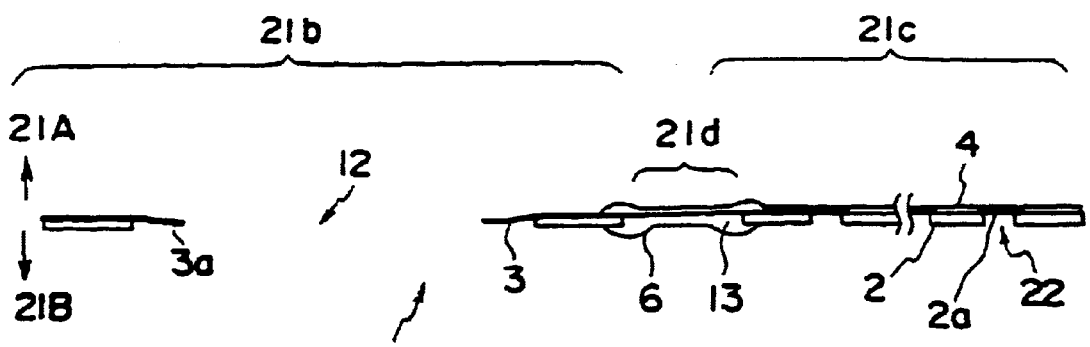
FIG. 2A is a cross-sectional view of a package film used in a semiconductor device in accordance with a second embodiment of the present invention.
Figure 2B:
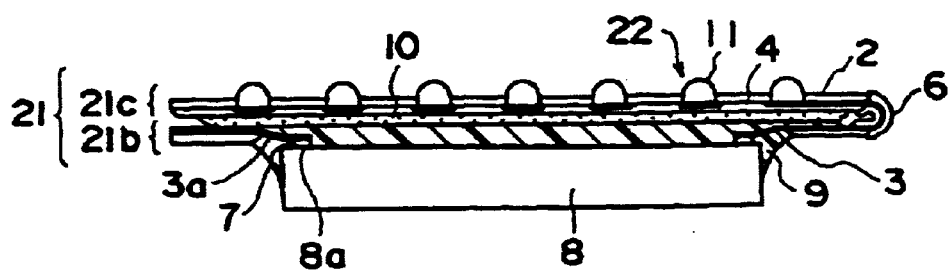
FIG. 2B is a cross-sectional structural diagram of the semiconductor device in accordance with the second embodiment of the present invention.

FIGS. 2A and 2B are diagrams illustrating the structure of a semiconductor device and a process for manufacturing the same in accordance with a second embodiment of the present invention. FIG. 2A is a cross-sectional view of a package film 21 used in this semiconductor device, and FIG. 2B is a cross-sectional structural diagram of the semiconductor device in accordance with the second embodiment.

First, the package film 21 is formed, as shown in FIG. 2A. That is, the base resin 2 is subjected to press punching, thereby forming the device hole 12, the bending hole 13, and electrode pad holes 2a for forming external electrode pads 22. Then, in the same procedure as that of the first embodiment, the inner leads 3 and the dummy inner leads 3a are formed on this base resin 2, and the insulating resin 4 is coated thereon. In addition, it is preferable to coat a bending portion 21d with the elastic resin 6. Thus the package film 21 having the external electrode pads 22 with openings facing a base-resin surface 21B (first surface) is fabricated.

Next, as shown in FIG. 2B, the LSI chip 8 is mounted on a device-mounting film portion 21b of the package film 21 with the base-resin surface 21B set on the LSI chip 8 side. Namely, in the same procedure as that of the above-described first embodiment, the inner leads 3 and the dummy inner leads 3a are bonded to the chip electrode pads 8a of the LSI chip 8 where the bumps 7 have been formed. Then, the LSI chip 8 is fixed and mounted on the device-mounting film portion 21b by the encapsulating resin 9, and an external-connection film portion 21c is bent 180° at the bending portion 21d toward an inner-lead forming surface 21A (second surface), and is secured to the surface of the encapsulating film 9 in the device-mounting film portion 21b by means of the adhesive 10. Finally, the solder balls 11 are deposited on the external electrode pads 22.

As described above, in accordance with the second embodiment, in the process for fabrication of the package film, the electrode pad holes 2a are formed in advance during the press punching of the device hole 12 and the like, and the external electrode pads 22 are formed in the electrode pad holes 2a by subjecting the inner leads 3 to patterning. As a result, it is possible to reduce the number of fabrication steps of the package film (the number of processing steps of the photolithographic etching of the insulating resin) and reduce the material cost (insulating resin), thereby making it possible to further lower the cost of the semiconductor device.

Incidentally, in FIG. 2B, a structure may be adopted in which the solder balls 11 are not deposited on the external electrode pads 22.

A third embodiment of the present invention is characterized in that the inner leads are bonded directly to the electrode pads of the LSI chip without forming the bumps.

Figure 3A:
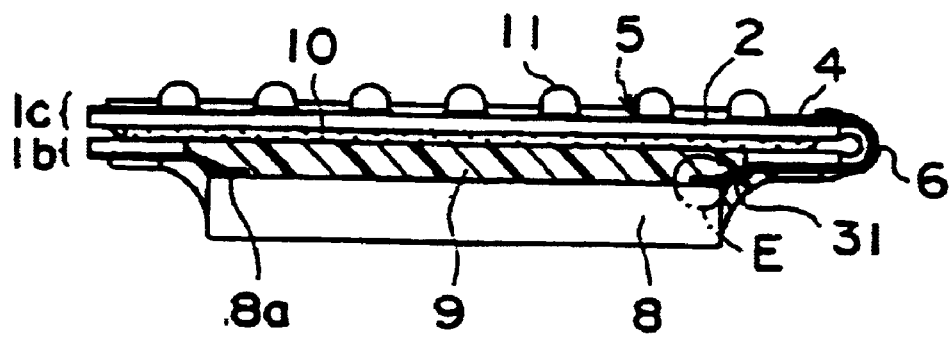
FIG. 3A is an overall cross-sectional view of a semiconductor device in accordance with a third embodiment of the present invention.
Figure 3B:
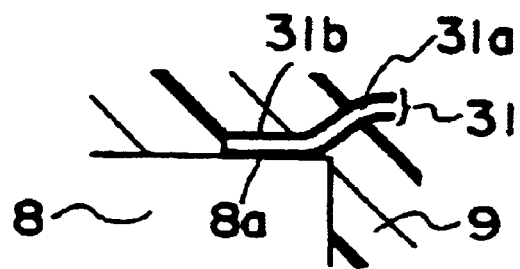
FIG. 3B is an enlarged partial cross-sectional view of a region E shown in FIG. 3A.

FIGS. 3A and 3B are cross-sectional structural diagrams of a semiconductor device in accordance with the third embodiment of the present invention, in which FIG. 3A is an overall cross-sectional view, and FIG. 3B is a partial cross-sectional view of a region E shown in FIG. 3A. It should be noted that the structure and the manufacturing process other than those described below are the same as those of the above-described first embodiment.

In FIGS. 3A and 3B, inner leads 31 are formed by subjecting a copper foil 31a to gold plating 31b and by annealing the same at 150° C. for 30 minutes or thereabouts (the same holds true of the dummy inner leads). The inner leads 31 and the dummy inner leads are collectively bonded directly to the chip electrode pads 8a of the LSI chip 8 by thermo-compression bonding without the bumps.

Generally, if the bumps are not provided, the damage to the electrode pads of the LSI chip is large, and cracks or the like occur below the pads. However, as for the inner leads 31 formed by subjecting the copper foil 31a to the gold plating 31b, their hardness can be lowered by annealing or the like. Hence, by using the softened inner leads 31, direction bonding is made possible in which the damage to the chip electrode pads is alleviated and cracks or the like do not occur below the pads.

Thus, in accordance with the third embodiment, since the process for forming the bumps on the electrode pads of the LSI chip is made unnecessary, it is possible to reduce the manufacturing cost, thereby making it possible to lower the cost of the semiconductor device.

Incidentally, it goes without saying that this third embodiment is also applicable to the above-described second embodiment. In addition, it is possible to adopt the structure in which the solder balls 11 are not deposited on the external electrode pads 5.

Figure 4A:
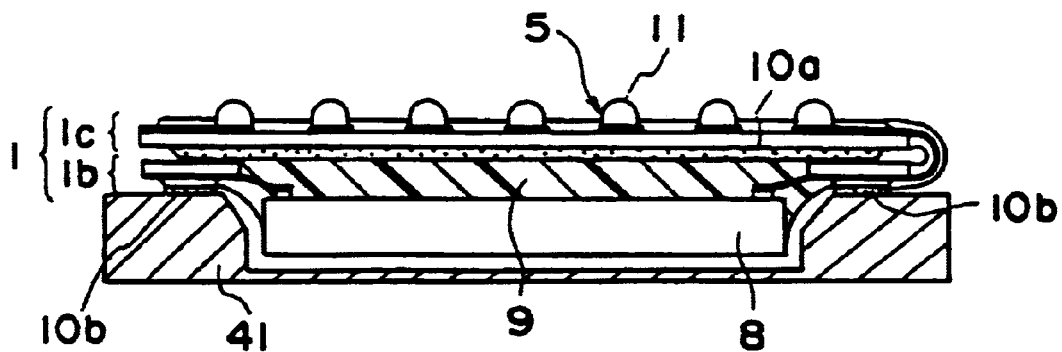
FIG. 4A is a cross-sectional structural diagram of a semiconductor device in accordance with a fourth embodiment of the present invention in which the semiconductor device in the first embodiment of the present invention is provided with a box-shaped protective frame.
Figure 4B:
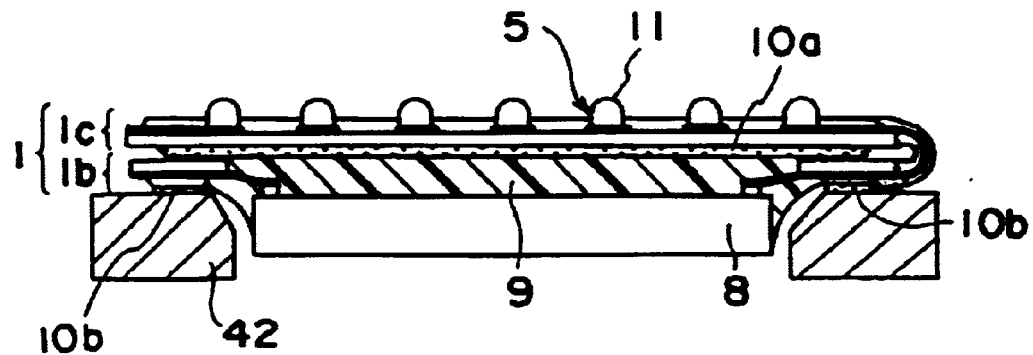
FIG. 4B is a cross-sectional structural diagram of the semiconductor device in accordance with the fourth embodiment of the present invention in which the semiconductor device in the first embodiment of the present invention is provided with a bottomless protective frame.

A fourth embodiment of the present invention is characterized in that a protective frame is provided for protecting the side surfaces and the reverse surface of the LSI chip. FIGS. 4A and 4B are cross-sectional structural diagrams illustrating a semiconductor device in accordance with the fourth embodiment of the present invention. This semiconductor device is arranged such that the semiconductor device in accordance with the above-described first embodiment is provided with a box-shaped protective frame 41 as shown in FIG. 4A or a bottomless protective frame 42 as shown in FIG. 4B. The protective frame 41 is provided in such a manner as to cover the side surfaces and the reverse surface of the LSI chip 8, while the protective frame 42 is provided in such a manner as to cover the side surfaces of the LSI chip 8. These protective frames 41 and 42 are obtained by forming an insulating material or an electrically conductive material, such as a resin or a metal, and are fixed to the device-mounting film portion 1b of the package film 1 by means of an adhesive 10b.

Thus, in accordance with the fourth embodiment, since the protective frame 41 or 42 is provided, the side surfaces and the reverse surface of the LSI chip 8 can be protected, with the result that it is possible to prevent the occurrence of the breakage of the side surfaces and the reverse surface of the LSI chip 8 during its handling, and an improvement in the yield during mounting can be expected.

Incidentally, it goes without saying that this fourth embodiment is also applicable to the above-described second or third embodiment. In addition, it is possible to adopt the structure in which the solder balls 11 are not deposited on the external electrode pads 5.

Figure 5:
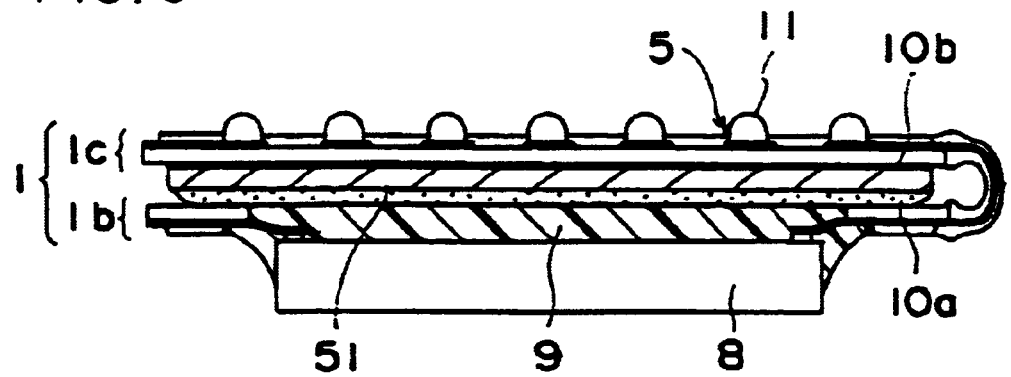
FIG. 5 is a cross-sectional structural diagram of a semiconductor device in accordance with a fifth embodiment of the present invention.

A fifth embodiment of the present invention is characterized in that a flat plate is provided for improving the flatness of the external-connection film portion. FIG. 5 is a cross-sectional structural diagram of a semiconductor device in accordance with the fifth embodiment of the present invention. The semiconductor device shown in FIG. 5 is arranged such that, in the semiconductor device in accordance with the above-described first embodiment, a flat plate 51 formed of an insulating material or an electrically conductive material such as a metal is provided between the device-mounting film portion 1b and the external-connection film portion 1c of the package film 1. This flat plate 51 is fixed between the surface of the encapsulating resin 9 of the device-mounting film portion 1b and the external-connection film portion 1c by using adhesives 10a and 10b. As the procedure for attaching the flat plate 51, after the completion of the step shown in FIG. 1B, for example, the flat plate 51 is fixed to an encapsulating-resin forming portion of the device-mounting film portion 1b by means of the adhesive 10a, and the external-connection film portion 1c is then bent 180° and is fixed to the flat plate 51 by means of the adhesive 10b.

Thus, in accordance with the fifth embodiment, since the flat plate 51 is provided between the device-mounting film portion 1b and the external-connection film portion 1c, the flatness of the external-connection film portion 1c and the solder balls 11 can be improved. Hence, it is possible to improve the mountability of the semiconductor device onto a mother board. In addition, in the case where a metal plate or the like is used as the flat plate, it is possible to improve the heat radiation characteristic of the semiconductor device.

Incidentally, it goes without saying that this fifth embodiment is also applicable to the above-described second, third, or fourth embodiment. In addition, it is possible to adopt the structure in which the solder balls 11 are not deposited on the external electrode pads 5.

Figure 6:
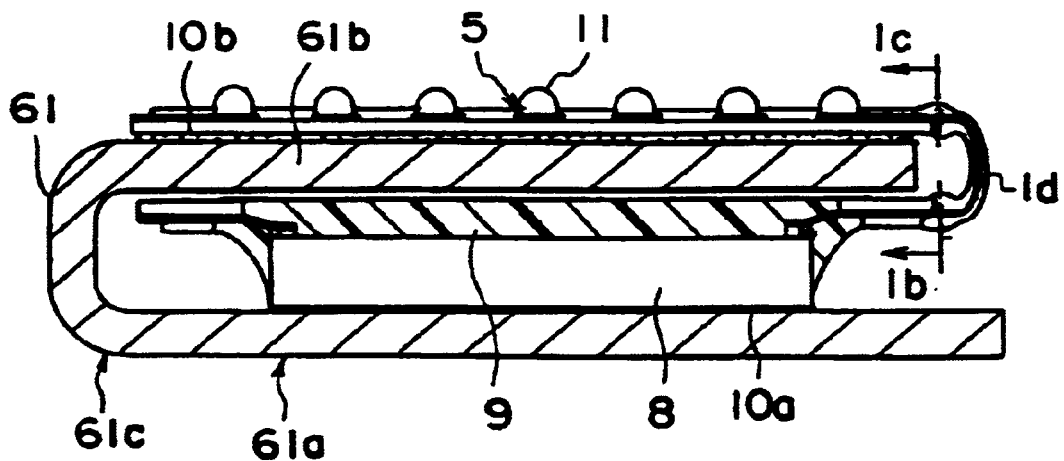
FIG. 6 is a cross-sectional structural diagram of a semiconductor device in accordance with a sixth embodiment of the present invention.

A sixth embodiment of the present invention is characterized in that a substantially U-shaped plate is provided for improving the flatness of the external-connection film portion and for protecting the reverse surface of the LSI chip. FIG. 6 is a cross-sectional structural diagram of a semiconductor device in accordance with the sixth embodiment of the present invention. The semiconductor device shown in FIG. 6 is arranged such that a substantially U-shaped plate 61 formed substantially into a U shape by using an insulating material or an electrically conductive material such as a metal is provided in the semiconductor device in accordance with the above-described first embodiment. The LSI chip 8 is attached to the inner surface of a bottom plate portion 61a of the substantially U-shaped plate 61 (hence, the device-mounting film portion 1b and the LSI chip 8 are located between the bottom plate 61a and a top plate portion 61b), and the external-connection film portion 1c is attached to the outer surface of the top plate portion 61b. As the procedure for attaching the substantially U-shaped plate 61, after the completion of the step shown in FIG. 1B, for example, the bottom surface of the LSI chip 8 is fixed to the bottom plate portion 61a by means of the adhesive 10a, and the external-connection film portion 1c is then bent 180° and is fixed to the top plate portion 61b by means of the adhesive 10b. Alternatively, in the case where the metal plate or the like is used as the substantially U-shaped plate 61, the LSI chip 8 is fixed to the flat plate, the remaining portion of the flat plate is turned back 180° to form the substantially U-shaped plate 61, and the external-connection film portion 1c is finally bent 180° and is fixed to the top plate portion 61b. Incidentally, although, in FIG. 6, the orientation of the inner surface of the bending portion 1d of the package film 1 (from right to left) and the orientation of the inner surface of a curved portion 61c of the substantially U-shaped plate (from left to right) are in a positional relationship of being offset from each other 180° in a plan view, but may be set in a positional relationship of being offset from each other 90° in a plan view.

Thus, in accordance with the sixth embodiment, since the arrangement provided is such that, by using the substantially U-shaped plate 61, the LSI chip 8 is attached to the inner surface of the bottom plate portion 61a thereof, and the external-connection film portion 1c is attached to the outer surface of the top plate portion 61b, it is possible to improve the flatness of the external-connection film portion 1c and the solder balls 11, and protect the LSI chip. In addition, in the case where a metal plate or the like is used as the substantially U-shaped plate 61, it is possible to further improve the heat radiation characteristic of the package.

Incidentally, it goes without saying that this sixth embodiment is also applicable to the above-described second or third embodiment. In addition, it is possible to adopt the structure in which the solder balls 11 are not deposited on the external electrode pads 5.

Figure 7A:
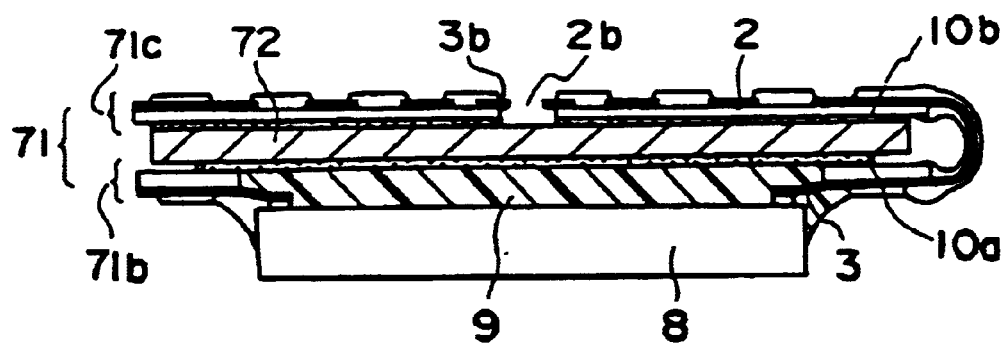
FIG. 7A is a cross-sectional structural diagram of a semiconductor device in accordance with a seventh embodiment of the present invention.
Figure 7B:
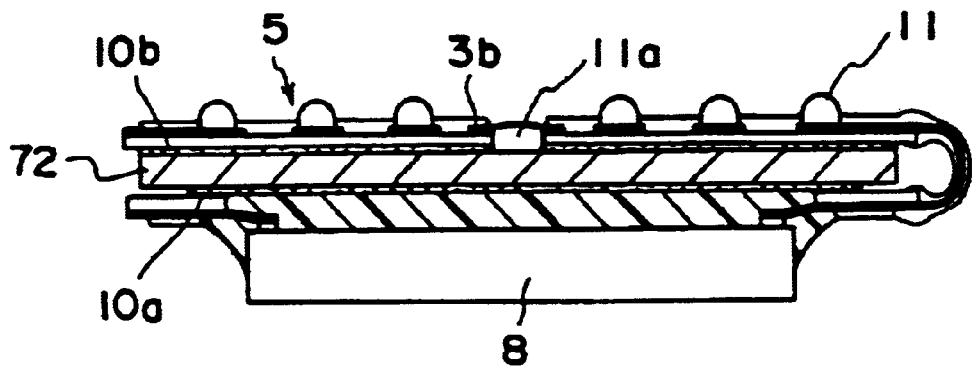
FIG. 7B is a diagram illustrating the process of manufacturing the semiconductor device in accordance with the seventh embodiment of the present invention.

A seventh embodiment of the present invention is characterized in that the external-connection film portion is formed as a two-layered structure in which both surfaces are electrically conductive. FIGS. 7A and 7B are diagrams illustrating the structure of a semiconductor device and a manufacturing process in accordance with the seventh embodiment of the present invention.

First, as shown in FIG. 7A, a package film 71 having a through hole 2b for a reference power supply (grounded power supply) is formed in an external-connection film portion 71c. Namely, when the device hole and the bending hole are formed in the base resin 2, the through hole 2b is also formed simultaneously by press punching, and a reference (grounded) power supply inner lead 3b is formed in such a manner as to lead to the through hole 2b. Subsequently, the package film 71 is fabricated in the same procedure as that of the above-described first embodiment. Next, in the same procedure as that of the above-described first embodiment, the LSI chip 8 is mounted on the package film 71. Then, in the same procedure as that of the above-described fifth embodiment, the external-connection film portion 71c is bent, an electrically conductive flat plate 72 is provided between a device-mounting film portion 71b and the external-connection film portion 71c by means of the adhesives 10a and 10b, and the adhesive 10b at the bottom of the through hole 2b is removed.

Next, as shown in FIG. 7B, a solder ball 11a (electrically conductive material) is deposited in the through hole 2b (at this time, the solder balls 11 are deposited on the external electrode pads 5). Next, this chip-size package is subjected to heat treatment to melt the solder ball 11a, so as to allow the reference power supply inner lead 3b and the flat plate 72 (serving as the reference power supply) to be electrically connected to each other. Incidentally, the volume of the through hole 2b and the volume of the solder ball 11a should preferably be substantially identical.

Thus, in accordance with the seventh embodiment, since, on the one hand, the electrically conductive flat plate 72 provided between the device-mounting film portion 71b and the external-connection film portion 71c and, on the other hand, the reference power supply inner lead 3b are electrically connected so as to provide the two-layered structure in which both surfaces are electrically conductive, it is possible to improve the flatness of the external-connection film portion, improve the heat radiation characteristic of the LSI chip, and reduce the crosstalk noise. Therefore, the operating speed of the LSI chip can be made faster.

Incidentally, the external electrode pads may be formed on the base-resin surface side of the package film as in the above-described second embodiment. Further, the inner leads may be bonded directly to the chip electrode pads without using bumps as in the above-described third embodiment. In addition, an electrically conductive substantially U-shaped plate such as the one use in the above-described sixth embodiment may be used without using the electrically conductive flat plate. Still further, it is possible to adopt the structure in which the solder balls 11 are not deposited on the external electrode pads 5.

Figure 8A:
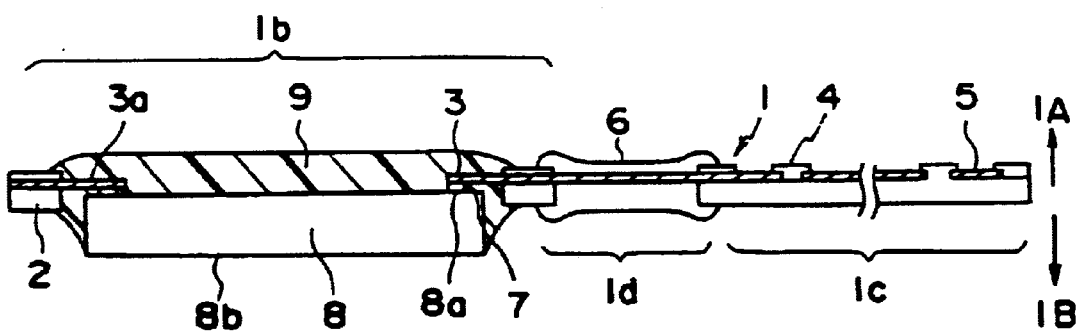
FIG. 8A is a cross-sectional structural diagram of a semiconductor device in accordance with an eighth embodiment of the present invention.
Figure 8B:
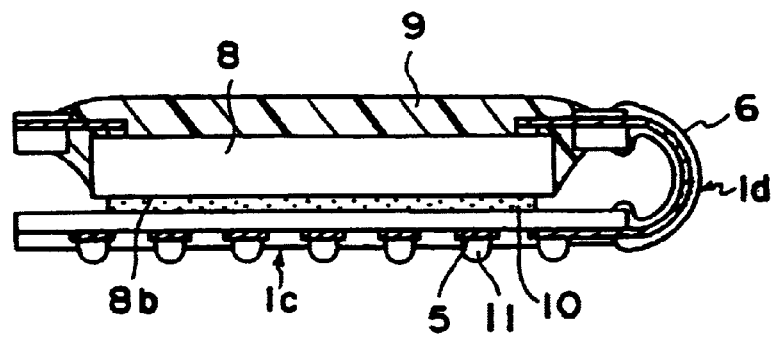
FIG. 8B is a diagram illustrating the process of manufacturing the semiconductor device in accordance with the eighth embodiment of the present invention.

An eighth embodiment of the present invention is characterized in that the external-connection film portion is bent toward the reverse surface of the LSI chip and is fixed thereto. FIGS. 8A and 8B are diagrams illustrating the structure of a semiconductor device and a manufacturing process in accordance with the eighth embodiment of the present invention. Incidentally, in FIGS. 8A and 8B, those parts and portions which are identical to those shown in FIGS. 1 to 7 are denoted by the same reference numerals.

First, as shown in FIG. 8A, by using the package film 1 in the above-described first embodiment (see FIGS. 1A and 1B), the LSI chip 8 is mounted on the base resin surface 1B of the device-mounting film portion 1b in a state in which the base-resin surface 1B (second surface) of the package film 1 is set as the LSI chip 8 side. Namely, in the device-mounting film portion 1b of the package film 1, the inner leads 3 and the dummy inner leads 3a are collectively bonded by thermo-compression bonding to the chip electrode pads 8a of the LSI chip 8 on which the bumps 7 have been formed. Then, the encapsulating resin 9 is allowed to flow into the space formed by the device-mounting film portion 1b and the surface of the LSI chip 8, thereby fixing and mounting the LSI chip 8 with respect to the device-mounting film portion 1b.

Then, as shown in FIG. 8B, the external-connection film portion 1c is bent 180° at the bending portion 1d in such a manner as to be superposed on a reverse surface 8b side of the LSI chip 8, and is secured to the reverse surface 8b of the chip by means of the adhesive 10. Finally, the solder balls 11 are deposited on the external electrode pads 5.

Thus, in accordance with the eighth embodiment, since the external-connection film portion 1c is bent toward the reverse surface 8b of the LSI chip 8 and is secured thereto, it is possible to protect the reverse surface 8b and the side surfaces of the LSI chip 8 without using a protective frame or the like. In addition, it is possible to flatten the external-connection film portion 1c without using a flat plate. Furthermore, it is possible to lower the cost of the semiconductor device and improve its reliability.

Incidentally, the external electrode pads may be formed on the base-resin surface side of the package film as in the above-described second embodiment. In this case, the inner-lead forming surface of the external-connection film portion is bonded to the reverse surface of the LSI chip 8. Further, the inner leads may be bonded directly to the chip electrode pads 8a without using bumps as in the above-described third embodiment. Furthermore, it is possible to adopt the structure in which the solder balls 11 are not deposited on the external electrode pads 5.

Figure 9A:
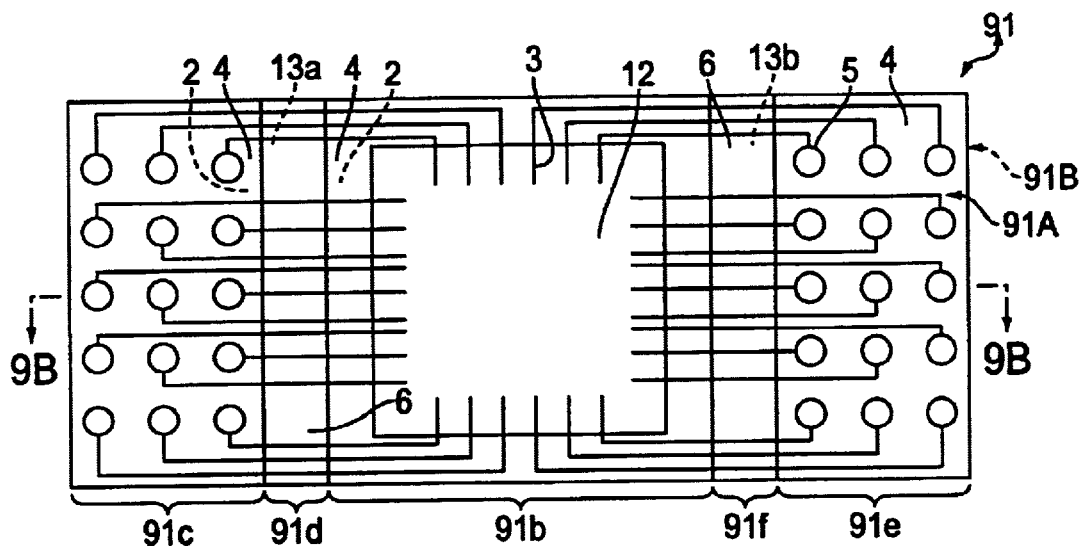
FIG. 9A is a front elevational view, taken from the inner-lead forming surface (first surface) side, of a package film used in a semiconductor device in accordance with a ninth embodiment of the present invention.
Figure 9B:
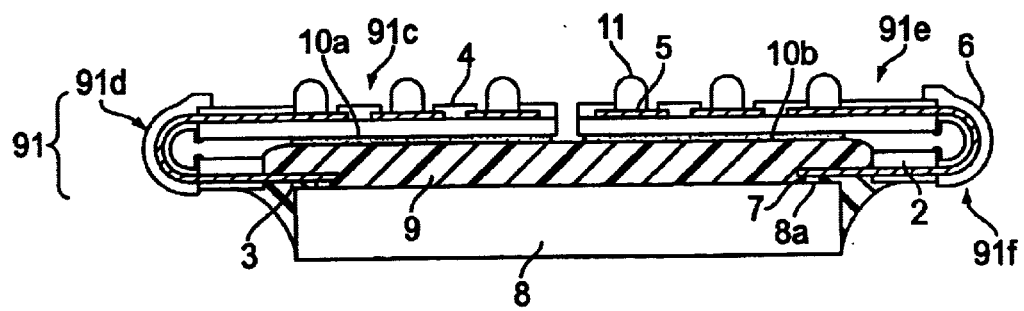
FIG. 9B is a cross-sectional view taken along line A–A' in FIG. 9A.

A ninth embodiment of the present invention is characterized in that the package film having external-connection film portions on both sides of the device-mounting film portion is used, and these external-connection film portions are respectively bent. FIGS. 9A and 9B are diagrams illustrating the structure of a semiconductor device and a manufacturing process in accordance with the ninth embodiment of the present invention. FIG. 9A is a front elevational view in which a package film 91 used in this semiconductor device is viewed from the inner-lead forming surface. FIG. 9B is a cross-sectional structural view, taken along line A–A' of FIG. 9A, of the semiconductor device in accordance with the ninth embodiment. Incidentally, in FIGS. 9A and 9B, those parts and portions which are identical to those shown in FIGS. 1 to 8 are denoted by the same reference numerals.

First, the package film 91 shown in FIG. 9A is fabricated by the same procedure as that of the above-described first embodiment. Namely, the inner leads 3 are formed by effecting patterning on the base resin 2 in which the device hole 12 and two bending holes 13a and 13b have been formed. Then, the insulating resin 4 is formed by effecting patterning thereon, thereby forming the external electrode pads 5. It should be noted that dummy inner leads are unnecessary. In addition, the elastic resin 6 should preferably be coated to prevent the deterioration of the strength of the inner leads 3 in bending portions 91d and 91f (portions where the bending holes 13a and 13b are formed). The package film 1 is fabricated in the above-described manner.

Next, as shown in FIG. 9B, the LSI chip 8 is mounted on a device-mounting film portion 91b in a state in which an inner-lead forming surface 91A (first surface) of a device-mounting film portion 91b of the package film 91 faces the surface of the LSI chip 8. Namely, in the device-mounting film portion 91b of the package film 91, the inner leads 3 are collectively bonded by thermo-compression bonding to the chip electrode pads 8a of the LSI chip 8 on which the bumps 7 have been formed. Then, the encapsulating resin 9 is allowed to flow into the space formed by the device-mounting film portion 91b and the surface of the LSI chip 8, thereby fixing and mounting the LSI chip 8 with respect to the device-mounting film portion 91b. Next, external-connection film portions 91c and 91e are respectively bent 180° at the bending portions 91d and 91f in such a manner as to be superposed on a base-resin surface 91B (second surface) of the device-mounting film portion 91b, and are secured to the surface of the encapsulating resin 9 by means of the adhesives 10a and 10b. Finally, the solder balls 11 are deposited on the external electrode pads 5.

Thus, in accordance with the ninth embodiment, since the external-connection film portions 91c and 91e are provided on both sides of the device-mounting film portion 91b, the length of the wiring (inner leads) from each chip electrode pad to each corresponding external electrode pad can be made shorter than in the above-described first embodiment, so that more efficient routing of the wiring becomes possible. Hence, the operating speed of the LSI chip can be made faster.

Incidentally, the external electrode pads may be formed on the base-resin surface side of the package film as in the above-described second embodiment. In this case, the LSI chip 8 is fixedly mounted in the state in which the base-resin surface side of the device-mounting film portion faces the surface of the LSI chip 8. Furthermore, it is possible to adopt the structure in which the solder balls 11 are not deposited on the external electrode pads 5.

A 10th embodiment of the present invention is characterized in that after the external-connection film portions formed on both side of the package film are bent; the encapsulating resin is allowed to flow in, and the LSI chip is mounted on the package film. FIG. 10 is a cross-sectional structural view illustrating a semiconductor device in accordance with the 10th embodiment of the present invention. Incidentally, in FIG. 10, those parts and portions which are identical to those shown in FIGS. 1 to 9 are denoted by the same reference numerals.

First, by using the package film 91 (see FIG. 9A) in accordance with the above-described ninth embodiment, the inner-lead forming surface 91A (first surface) of the package film 91 is set as the LSI chip 8 side. In the device-mounting film portion 91b of the package film 91, the inner leads 3 and the dummy inner leads 3a are collectively bonded by thermo-compression bonding to the chip electrode pads 8a of the LSI chip 8 on which the bumps 7 have been formed. Then, the external-connection film portions 91c and 91e are respectively bent 180° at the bending portions 91d and 91f in such a manner as to be superposed on the base-resin surface 91 side.

Next, the encapsulating resin 9 is injected into a gap 91g formed between the external-connection film portions 91c and 91e, with the result that the LSI chip 8 is fixed and mounted on the device-mounting film portion 91b, and the bent external-connection film portions 91c and 91e are fixed to the device-mounting film portion 91b. Finally, the solder balls 11 are deposited on the external electrode pads 5.

Thus, in accordance with the 10th embodiment, since the external-connection film portions 91c and 91e are bent, and the encapsulating resin 9 is injected into the gap 91g between these external-connection film portions to fix and mount the LSI chip 8 and fix the external-connection film portion 91c and 91e, the adhesive for fixing the external-connection film portions as well as the step for fixing the external-connection film portions by the adhesive are made unnecessary. Hence, it is possible to further lower the manufacturing cost.

Incidentally, the external electrode pads may be formed on the base-resin surface side of the package film as in the above-described second embodiment. Furthermore, it is possible to adopt the structure in which the solder balls 11 are not deposited on the external electrode pads 5.

An 11th embodiment of the present invention is characterized in that the inner leads formed on the package film having external-connection film portions on both sides of the device-mounting film portion are bonded directly on the electrode pads of the LSI chip without forming the bumps. FIG. 11 is a cross-sectional structural view illustrating a semiconductor device in accordance with the 11th embodiment of the present invention. Incidentally, in FIG. 11, those parts and portions which are identical to those shown in FIGS. 1 to 10 are denoted by the same reference numerals.

First, a package film 111 is fabricated. This package film 111 is arranged such that, in the package film 91 (see FIG. 9A) in accordance with the above-described ninth embodiment, not the inner leads 3 but the inner leads 31 in which the copper foil used in the above-described third embodiment is provided with gold plating are formed by patterning. To lower the hardness of the inner leads 31, in the same way as in the above-described third embodiment, annealing at 150° C. for 30 minutes or thereabouts is carried out. The inner leads 31 are collectively bonded directly to the chip electrode pads 8a of the LSI chip 8 by thermo-compression bonding without the bumps. Incidentally, the other manufacturing process is similar to that of the above-described ninth embodiment.

Thus, in accordance with the 11th embodiment, since the step for forming bumps on the electrode pads of the LSI chip becomes unnecessary, it is possible to reduce the manufacturing cost more than in the above-described ninth embodiment, thereby making it possible to further lower the cost of the semiconductor device.

Incidentally, it goes without saying that this 11th embodiment is also applicable to the above-described 10th embodiment. In addition, it is possible to adopt the structure in which the solder balls 11 are not deposited on the external electrode pads 5.

Figure 12A:
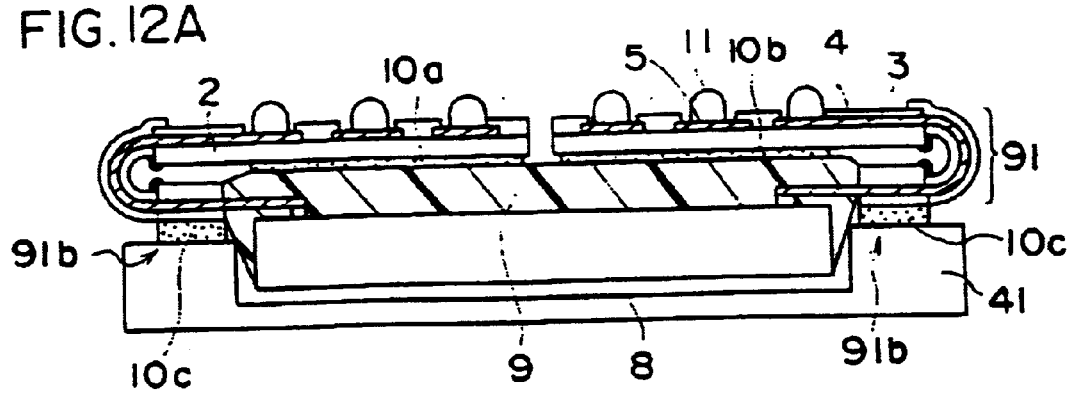
FIG. 12A is a cross-sectional structural diagram of a semiconductor device in accordance with a 12th embodiment of the present invention in which the semiconductor device in the ninth embodiment of the present invention is provided with the box-shaped protective frame.
Figure 12B:
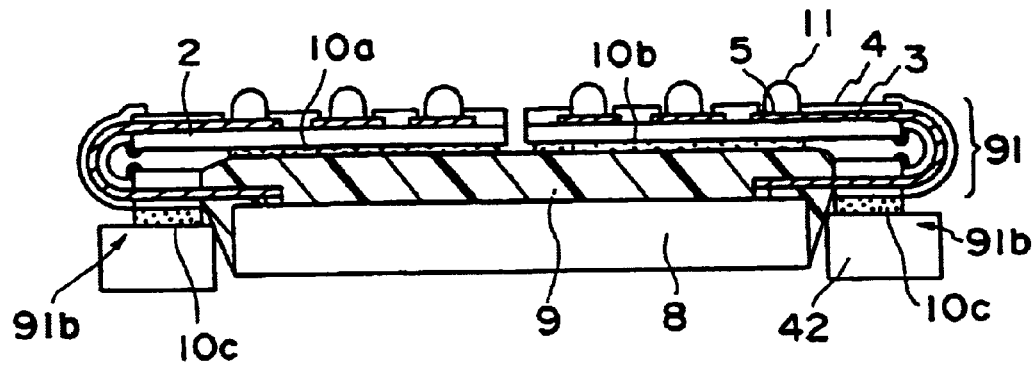
FIG. 12B is a cross-sectional structural diagram of the semiconductor device in accordance with the 12th embodiment of the present invention in which the semiconductor device in the ninth embodiment of the present invention is provided with the bottomless protective frame.

A 12th embodiment of the present invention is characterized in that a protective frame for protecting the side surfaces and the reverse surface of the LSI chip is provided on the semiconductor device having a structure in which two external-connection film portions formed on both side of the package film are bent. FIGS. 12A and 12B are cross-sectional structural views illustrating a semiconductor device in accordance with the 12th embodiment of the present invention. Incidentally, in FIGS. 12A and 12B, those parts and portions which are identical to those shown in FIGS. 1 to 11 are denoted by the same reference numerals.

The semiconductor device in accordance with the 12th embodiment is arranged such that the semiconductor device in accordance with the above-described ninth embodiment is provided with the box-shaped protective frame 41 shown in FIG. 12A or the bottomless protective frame 42 shown in FIG. 12B. These protective frames 41 and 42 are the same as those used in the above-described fourth embodiment, and are fixed to the device-mounting film portion 91b of the package film 91 by means of an adhesive 10c.

Thus, in accordance with the 12th embodiment, since the semiconductor device having the structure in which the two external-connection film portions are bent is provided with the protective frame 41 or 42, the side surfaces and the reverse surface of the LSI chip 8 can be protected, with the result that it is possible to prevent the occurrence of the breakage of the side surfaces and the reverse surface of the LSI chip 8 during its handling, and an improvement in the yield during mounting can be expected.

Incidentally, it goes without saying that this 12th embodiment is also applicable to the above-described 10th or 11th embodiment. In addition, it is possible to adopt the structure in which the solder balls 11 are not deposited on the external electrode pads 5.

Figure 13:
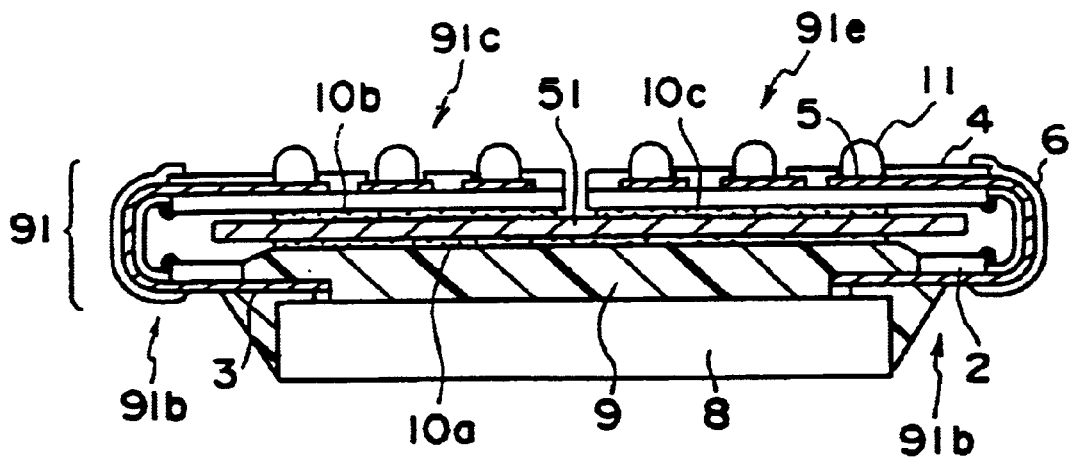
FIG. 13 is a cross-sectional structural diagram of a semiconductor device in accordance with a 13th embodiment of the present invention.

A 13th embodiment of the present invention is characterized in that a plate is provided for improving the flatness of external-connection film portions which are formed on both sides of the package film and are respectively bent when the LSI chip is mounted on the package film. FIG. 13 is a cross-sectional structural view illustrating a semiconductor device in accordance with the 13th embodiment of the present invention. Incidentally, in FIG. 13, those parts and portions which are identical to those shown in FIGS. 1 to 12 are denoted by the same reference numerals.

The semiconductor device shown in FIG. 13 is arranged such that, in the semiconductor device in accordance with the above-described ninth embodiment, the flat plate 51 formed of an insulating material or an electrically conductive material such as a metal, which is used in the above-described fifth embodiment, is provided between the device-mounting film portion 91b of the package film 91 and the external-connection film portions 91c and 91e. This flat plate 51 is fixed between the surface of the encapsulating resin 9 of the device-mounting film portion 91b and the external-connection film portions 91c and 91e by using the adhesives 10a, 10b, and 10c.

Thus, in accordance with the 13th embodiment, since the flat plate 51 is provided between the device-mounting film portion 91b and the external-connection film portions 91c and 91e, the flatness of the external-connection film portions 91c and 91e, i.e., the flatness of the solder balls 11, can be improved, thereby making it possible to improve the mountability of the semiconductor device onto a mother board. In addition, in the case where a metal plate or the like is used as the flat plate, it is possible to improve the heat radiation characteristic of the semiconductor device.

Incidentally, it goes without saying that this 13th embodiment is also applicable to the above-described 11th or 12th embodiment. In addition, it is possible to adopt the structure in which the solder balls 11 are not deposited on the external electrode pads 5. Furthermore, a substantially U-shaped plate such as the one used in the above-described sixth embodiment may be used instead of using the flat plate.

Further, by using an electrically conductive flat plate or substantially U-shaped plate, in the same way as in the above-described seventh embodiment, the external-connection film portions may be formed as the two-layered structure in which both surfaces are electrically conductive, wherein a reference power supply inner lead is formed on the package film 91, through holes are respectively provided in the external-connection film portions 91c and 91e, and the reference power supply inner lead and the electrically conductive flat plate or substantially U-shaped plate are electrically connected via these through holes. Consequently, since the crosstalk noise can be reduced, the operating speed of the LSI chip can be made even faster.

Figure 14:
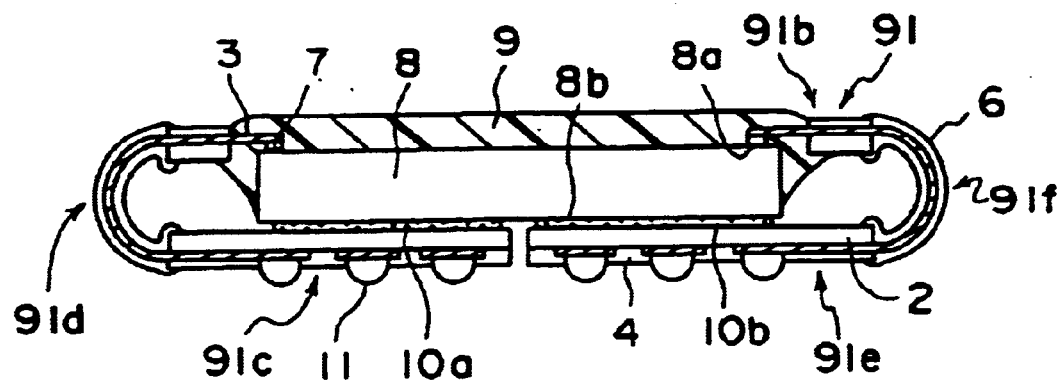
FIG. 14 is a cross-sectional structural diagram of a semiconductor device in accordance with a 14th embodiment of the present invention.

A 14th embodiment of the present invention is characterized in that the external-connection film portions formed on both sides of the package film are respectively bent toward the reverse surface of the LSI chip and are fixed thereto. FIG. 14 is a diagram illustrating the structure of a semiconductor device in accordance with the 14th embodiment of the present invention. Incidentally, in FIG. 14, those parts and portions which are identical to those shown in FIGS. 1 to 13 are denoted by the same reference numerals.

First, as shown in FIG. 14, by using the package film 91 in the above-described ninth embodiment (see FIG. 9A), the LSI chip 8 is mounted on the device-mounting film portion 91b in a state in which the base-resin surface 91B (second surface) of the device-mounting film portion 91b of the package film 91 faces the surface of the LSI chip 8. Namely, in the device-mounting film portion 91b of the package film 91, the inner leads 3 are collectively bonded by thermo-compression bonding to the chip electrode pads 8a of the LSI chip 8 on which the bumps 7 have been formed. Then, the encapsulating resin 9 is allowed to flow into the space formed by the device-mounting film portion 91b and the surface of the LSI chip 8, thereby fixing and mounting the LSI chip 8 with respect to the device-mounting film portion 91b.

Next, the external-connection film portions 91c and 91e are respectively bent 180° at the bending portions 91d and 91f in such a manner as to be superposed on the reverse surface 8b side of the LSI chip 8, and are secured to the reverse surface 8b of the chip by means of the adhesives 10a and 10b. Finally, the solder balls 11 are deposited on the external electrode pads 5.

Thus, in accordance with the 14th embodiment, since the external-connection film portions 91c and 91e are bent toward the reverse surface 8b of the LSI chip 8 and are secured thereto, it is possible to protect the reverse surface 8b and the side surfaces of the LSI chip 8 without using a protective frame or the like. In addition, it is possible to flatten the external-connection film portions 91c and 91e without using a flat plate.

Incidentally, the external electrode pads may be formed on the base-resin surface side of the package film as in the above-described second embodiment. In this case, the inner-lead forming surface of the external-connection film portion is bonded to the reverse surface of the LSI chip 8. Further, the inner leads may be bonded directly to the chip electrode pads 8a without using bumps as in the above-described third and 11th embodiments. Furthermore, it is possible to adopt the structure in which the solder balls 11 are not deposited on the external electrode pads 5.

Figure 15A:
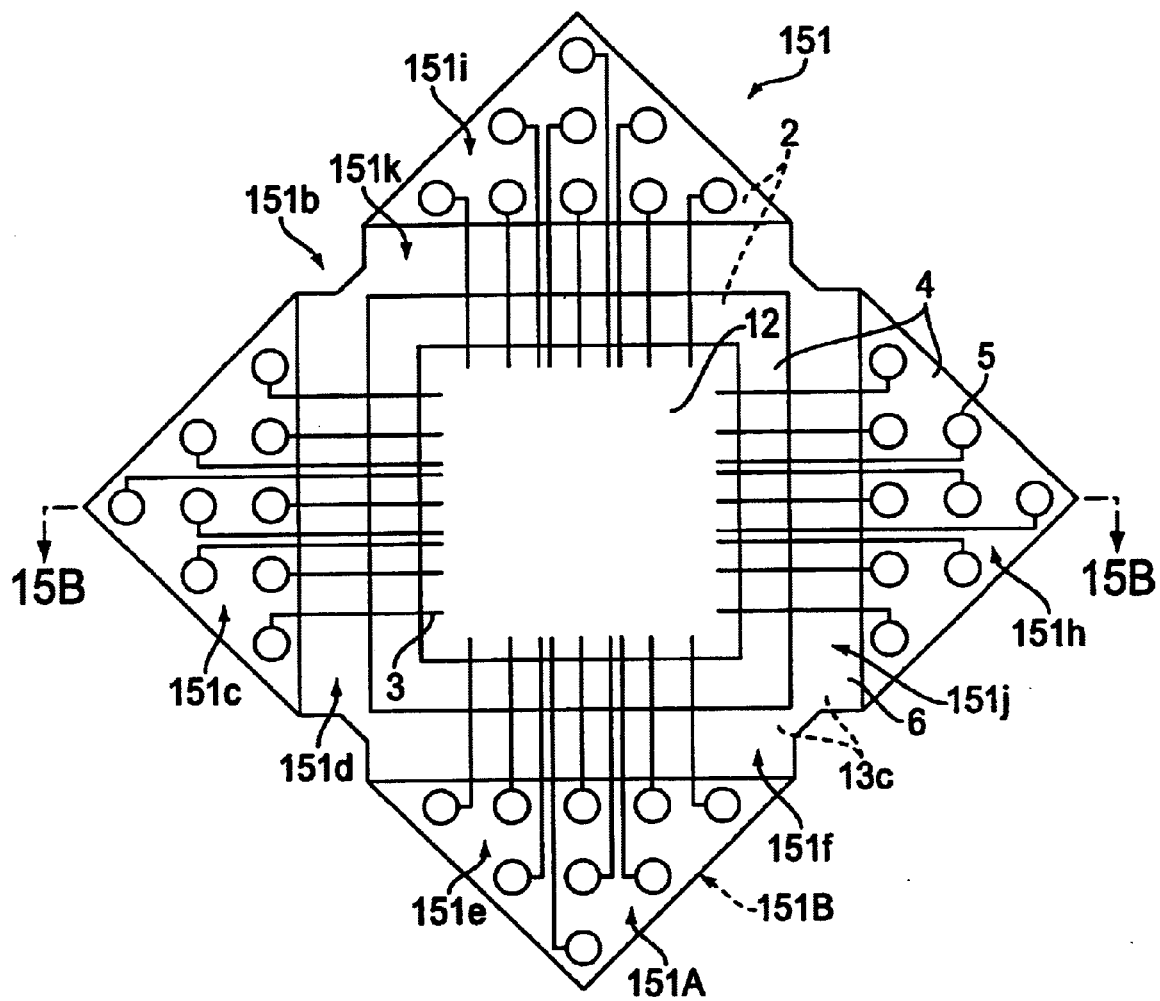
FIG. 15A is a top view, taken from the inner-lead forming surface (first surface) side, of a package film used in a semiconductor device in accordance with a 15th embodiment of the present invention.
Figure 15B:
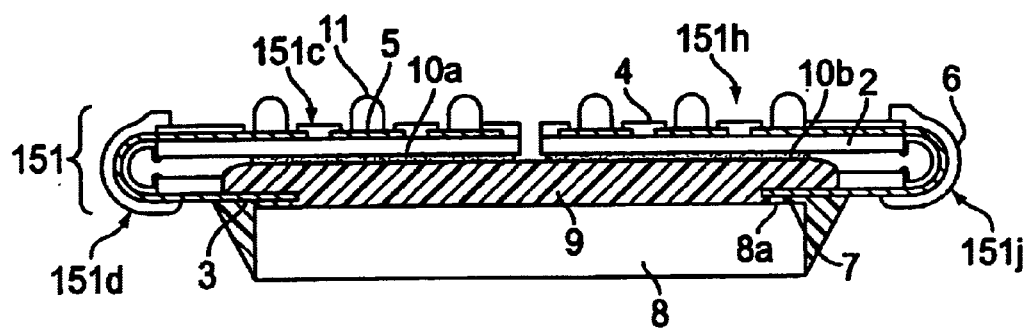
FIG. 15B is a cross-sectional view taken along line A–A' in FIG. 15A.

A 15th embodiment of the present invention is characterized in that the package film having external-connection film portions on four sides of the device-mounting film portion is used, and these external-connection film portions are respectively bent. FIGS. 15A and 15B are diagrams illustrating the structure of a semiconductor device and a manufacturing process in accordance with the 15th embodiment of the present invention. FIG. 15A is a front elevational view in which a package film 151 used in this semiconductor device is viewed from a inner-lead forming surface 151A. FIG. 15B is a cross-sectional structural view, taken along line A–A' of FIG. 15A, of the semiconductor device in accordance with the 15th embodiment. Incidentally, in FIGS. 15A and 15B, those parts and portions which are identical to those shown in FIGS. 1 to 14 are denoted by the same reference numerals.

First, the package film 151 shown in FIG. 15A is fabricated by the same procedure as that of the above-described first embodiment. Namely, the inner leads 3 are formed by effecting patterning on the base resin 2 in which the device hole 12 has been formed and a bending hole 13c has been formed in the shape of a frame in such a manner as to surround the device hole 12. Then, the insulating resin 4 is formed by effecting patterning thereon, thereby forming the external electrode pads 5. It should be noted that dummy inner leads are unnecessary. In addition, the elastic resin 6 should preferably be coated to prevent the deterioration of the strength of the inner leads 3 in bending portions 151d, 151f, 151j, and 151k (portions which respectively correspond to the four sides of the bending hole 13c formed in the shape of a square frame). The package film 151 is fabricated in the above-described manner.

Next, as shown in FIG. 15B, the LSI chip 8 is mounted on a device-mounting film portion 151b in a state in which the inner-lead forming surface 151A (first surface) of the device-mounting film portion 151b of the package film 151 faces the surface of the LSI chip 8. Namely, in the device-mounting film portion 151b of the package film 151, the inner leads 3 are collectively bonded by thermo-compression bonding to the chip electrode pads 8a of the LSI chip 8 on which the bumps 7 have been formed. Then, the encapsulating resin 9 is allowed to flow into the space formed by the device-mounting film portion 151b and the surface of the LSI chip 8, thereby fixing and mounting the LSI chip 8 with respect to the device-mounting film portion 151b. Next, external-connection film portions 151c, 151e, 151h, and 151i are respectively bent 180° at the bending portions 151d, 151f, 151j, and 151k in such a manner as to be superposed on a base-resin surface 151B (second surface) of the device-mounting film portion 151b, and are secured to the surface of the encapsulating resin 9 by means of the adhesives 10a and 10b. Finally, the solder balls 11 are deposited on the external electrode pads 5.

Thus, in accordance with the 15th embodiment, since the external-connection film portions are respectively provided on the four sides of the device-mounting film portion 151b, the length of the wiring (inner leads) from each chip electrode pad to each corresponding external electrode pad can be made shorter than in the above-described ninth embodiment, so that more efficient routing of the wiring becomes possible. Hence, the operating speed of the LSI chip can be made faster.

It should be noted that an arrangement may be provided such that, in the same way as in the above-described 10th embodiment, the four external-connection film portions are bent, and the encapsulating resin 9 is allowed to flow into the gap at the bent portions. Further, the inner leads may be bonded directly to the chip electrode pads 8a without using bumps as in the above-described third and 11th embodiments. Furthermore, it is possible to adopt the structure in which the solder balls 11 are not deposited on the external electrode pads 5.

Figure 16A:
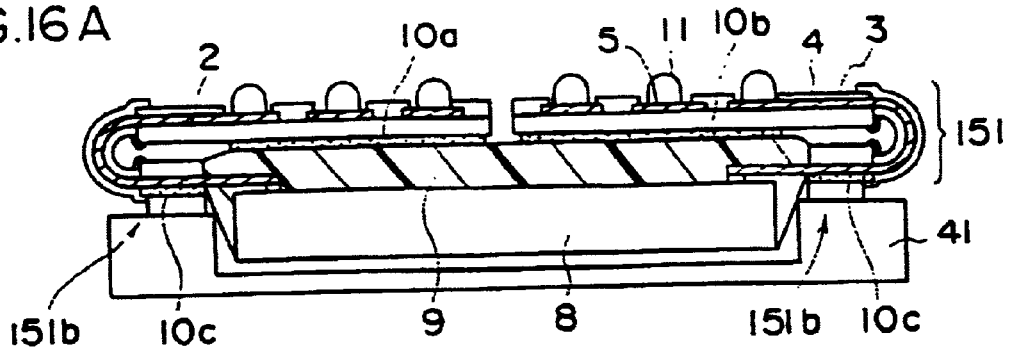
FIG. 16A is a cross-sectional structural diagram of a semiconductor device in accordance with a 16th embodiment of the present invention in which the semiconductor device in the 15th embodiment of the present invention is provided with the box-shaped protective frame.
Figure 16B:
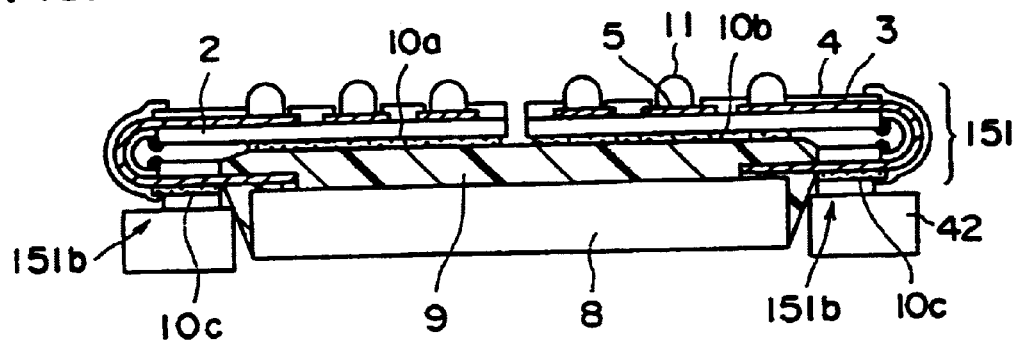
FIG. 16B is a cross-sectional structural diagram of the semiconductor device in accordance with the 16th embodiment of the present invention in which the semiconductor device in the 15th embodiment of the present invention is provided with the bottomless protective frame.

A 16th embodiment of the present invention is characterized in that the semiconductor device having the structure in which four external-connection film portions are bent is provided with a protective frame for protecting the side surfaces and the reverse surface of the LSI chip or a flat plate for improving the flatness of the bent external-connection film portions. FIGS. 16A and 16B are cross-sectional structural views illustrating a semiconductor device in accordance with the 16th embodiment of the present invention. Incidentally, in FIGS. 16A and 16B, those parts and portions which are identical to those shown in FIGS. 1 to 15 are denoted by the same reference numerals.

The semiconductor device in accordance with the 16th embodiment is arranged such that the semiconductor device in accordance with the above-described 15th embodiment is provided with the box-shaped protective frame 41 shown in FIG. 16A or the bottomless protective frame 42 shown in FIG. 16B. These protective frames 41 and 42 are the same as those used in the above-described fourth embodiment, and are fixed to the device-mounting film portion 151b of the package film 151 by means of an adhesive 10c.

Thus, in accordance with the 16th embodiment, since the semiconductor device having the structure in which the four external-connection film portions are bent is provided with the protective frame 41 or 42, the side surfaces and the reverse surface of the LSI chip 8 can be protected, with the result that it is possible to prevent the occurrence of the breakage of the side surfaces and the reverse surface of the LSI chip 8 during its handling, and an improvement in the yield during mounting can be expected.

It should be noted that, instead of using the protective film 41 or 42, it is possible to adopt an arrangement in which a flat plate such as the one used in the above-described fifth embodiment is provided between the four external-connection film portions and the surface of the encapsulating resin 9, or an arrangement in which both the protective film 41 or 42 and the aforementioned flat plate are provided. Further, by using an electrically conductive flat plate, in the same way as in the above-described seventh embodiment, the external-connection film portions may be formed as the two-layered structure in which both surfaces are electrically conductive, wherein a reference power supply inner lead is formed on the package film 151, through holes are respectively provided in the four external-connection film portions, and the reference power supply inner lead and the electrically conductive flat plate are electrically connected via these through holes. Furthermore, it is possible to adopt the structure in which the solder balls 11 are not deposited on the external electrode pads 5.

Figure 17:
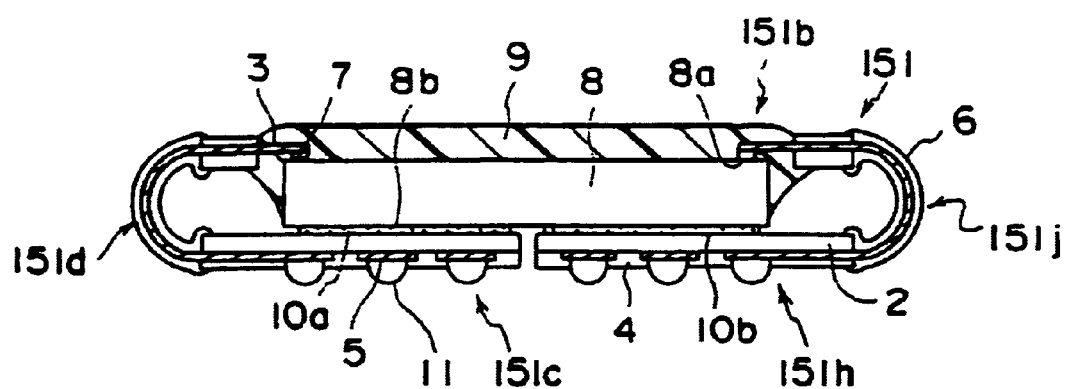
FIG. 17 is a cross-sectional structural diagram of a semiconductor device in accordance with a 17th embodiment of the present invention.

A 17th embodiment of the present invention is characterized in that the external-connection film portions formed on the four sides of the package film are respectively bent toward the reverse surface of the LSI chip and are fixed thereto. FIG. 17 is a diagram illustrating the structure of a semiconductor device in accordance with the 17th embodiment of the present invention. Incidentally, in FIG. 17, those parts and portions which are identical to those shown in FIGS. 1 to 16 are denoted by the same reference numerals.

First, as shown in FIG. 17, by using the package film 151 in the above-described 15th embodiment (see FIG. 15A), the LSI chip 8 is fixedly mounted on the device-mounting film portion 151b in the same procedure as that of the above-described 14th embodiment in the state in which the base-resin surface 151B (second surface) of the device-mounting film portion 151b of the package film 151 faces the surface of the LSI chip 8. Next, the four external-connection film portions including the external-connection film portions 151c and 151e are respectively bent 180° at the four bending portions including the bending portions 151d and 151f in such a manner as to be superposed on the reverse surface 8b side of the LSI chip 8, and are secured to the reverse surface 8b of the chip by means of the adhesives 10a and 10b. Finally, the solder balls 11 are deposited on the external electrode pads 5.

Thus, in accordance with the 17th embodiment, since the four external-connection film portions are bent toward the reverse surface 8b of the LSI chip 8 and are secured thereto, it is possible to protect the reverse surface 8b and the side surfaces of the LSI chip 8 without using a protective frame or the like. In addition, it is possible to flatten the external-connection film portions without using a flat plate.

Incidentally, the external electrode pads may be formed on the base-resin surface side of the package film as in the above-described second embodiment. In this case, the inner-lead forming surface of the external-connection film portion is bonded to the reverse surface of the LSI chip 8. Further, the inner leads may be bonded directly to the chip electrode pads 8a without using bumps as in the above-described third embodiment. Furthermore, it is possible to adopt the structure in which the solder balls 11 are not deposited on the external electrode pads 5.

Figure 18A:
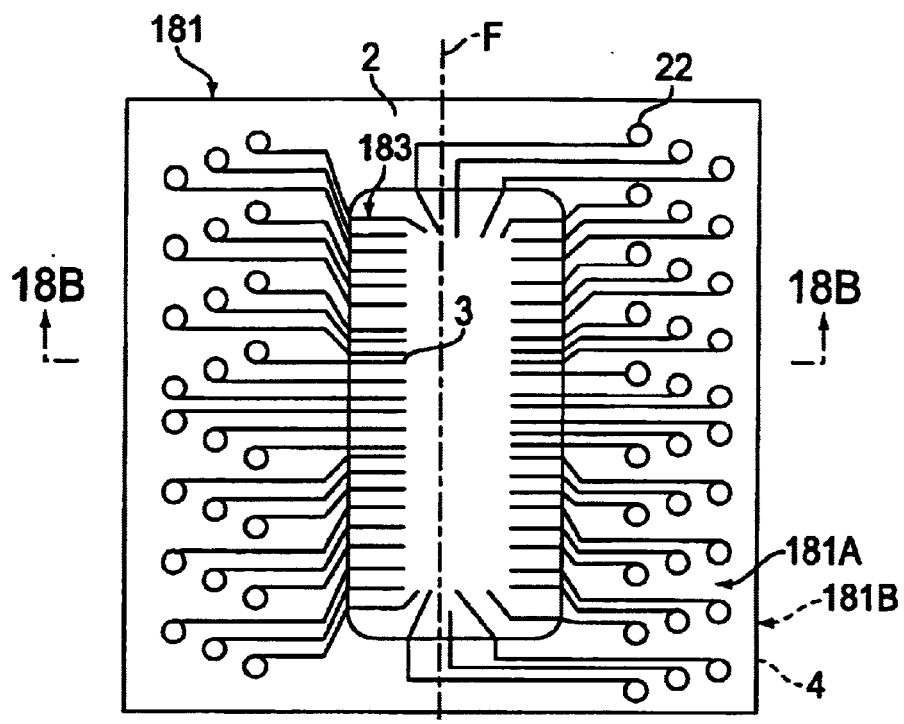
FIG. 18A is a top view, taken from an external connection surface side, of a package film used in a semiconductor device in accordance with an 18th embodiment of the present invention.
Figure 18B:
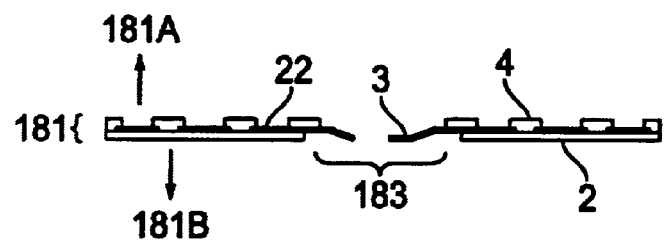
FIG. 18B is a cross-sectional view taken along line A–A' in FIG. 18A.
Figure 18C:
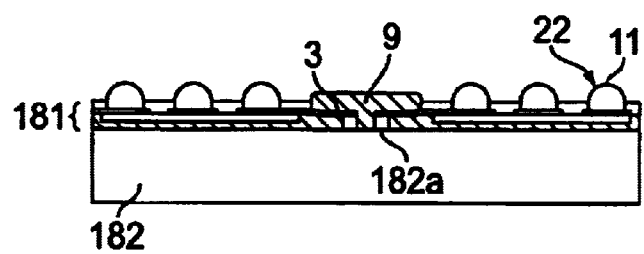
FIG. 18C is a cross-sectional structural diagram of the semiconductor device in accordance with the 18th embodiment of the present invention.

An 18th embodiment of the present invention is characterized in that an LSI chip in which the chip electrode pads are formed in the vicinity of a center line on the chip surface is used. FIGS. 18A to 18C are diagrams illustrating the structure of a semiconductor device and a manufacturing process in accordance with the 18th embodiment of the present invention. FIG. 18A is a plan view of an external connection surface 181A of a package film 181 used in this semiconductor device. FIG. 18B is a cross-sectional structural view taken along line A–A' of FIG. 18A. FIG. 18C is a cross-sectional structural diagram of this semiconductor device. Incidentally, in FIGS. 18A to 18C, those parts and portions which are identical to those shown in FIGS. 1 to 17 are denoted by the same reference numerals.

As shown in FIGS. 18A and 18B, with respect to an LSI chip 182 in which chip electrode pads 182a are formed in a region along a chip center line F, the package film 181 having a device hole 183 in a region along the center line F is fabricated in correspondence with the region of the LSI 182 where the chip electrode pads are formed, in the same procedure as that of the above-described second embodiment. At this time, the bending hole is not formed, and the size of the package film 181 is set to be substantially identical as the size of the LSI chip.

Next, as shown in FIG. 18C, in the same procedure as that of the above-described second embodiment, the inner leads 3 are bonded to the chip electrode pads 182a of the LSI chip 182, the LSI chip 182 is mounted on the package film 181 (however, there is no step for bending the package film), and the solder balls 11 are deposited on the external electrode pads 22.

Thus, in accordance with the 18th embodiment, since the LSI chip 182 in which the chip electrode pads 182a are formed along the chip center line is mounted on the package film 181 having the device hole 183 at the position corresponding to the chip-electrode-pad forming region and having substantially the same size as the LSI chip 182, a special elastic adhesive and a substrate whose coefficient of thermal expansion differs from that of the LSI chip are not used, it is possible to improve the reliability of the semiconductor device. In addition, it is possible to reduce the number of processing steps (the number of bending steps of the package film) and reduce the material cost, thereby making it possible to further lower the cost of the semiconductor device. Moreover, a more compact and lightweight semiconductor device can be realized as compared with the above-described first embodiment.

It should be noted that the inner leads may be bonded directly to the chip electrode pads as in the above-described third embodiment. Furthermore, it is possible to adopt the structure in which the solder balls 11 are not deposited on the external electrode pads 22.

Figure 19A:
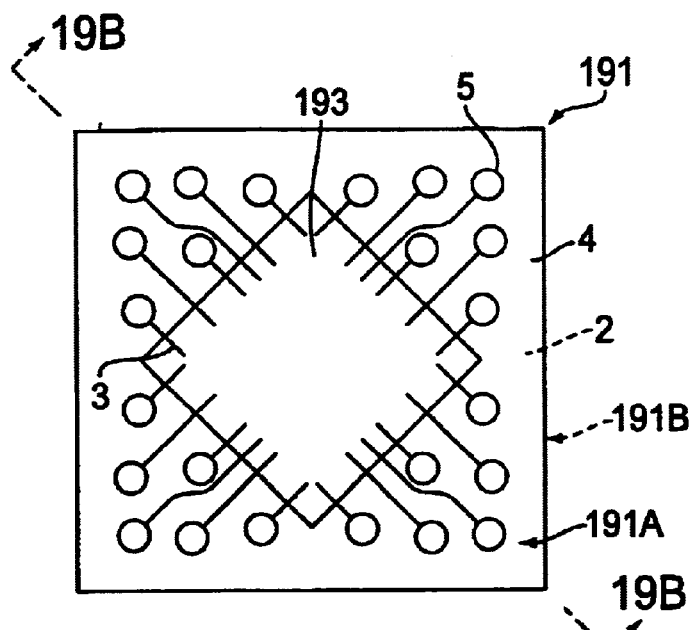
FIG. 19A is a top view, taken from the external connection surface side, of a package film used in a semiconductor device in accordance with a 19th embodiment of the present invention.
Figure 19B:
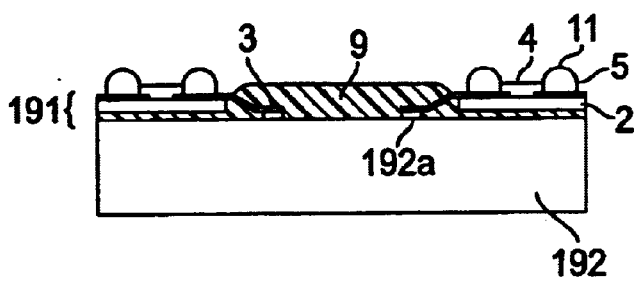
FIG. 19B is a cross-sectional view taken along line A–A' in FIG. 19A.

A 19th embodiment of the present invention is characterized in that an LSI chip in which the chip electrode pads are formed in a central portion of the chip surface is used. FIGS. 19A and 19B are diagrams illustrating the structure of a semiconductor device and a manufacturing process in accordance with the 19th embodiment of the present invention. FIG. 19A is a plan view of an external connection surface 191A of a package film 191 used in this semiconductor device. FIG. 19B is a cross-sectional structural view, taken along line A–A' of FIG. 19A, of the semiconductor device in accordance with the 19th embodiment. Incidentally, in FIGS. 19A and 19B, those parts and portions which are identical to those shown in FIGS. 1 to 18 are denoted by the same reference numerals.

First, as shown in FIG. 19A, with respect to an LSI chip 192 in which chip electrode pads 192a are formed in a vicinity of a central portion of the chip, the package film 191 having a device hole 193 in its central portion is fabricated in correspondence with the region of the LSI 192 where the chip electrode pads are formed, in the same procedure as that of the above-described first embodiment. The size of the package film 191 is set to be substantially identical as the size of the LSI chip 192. In addition, the position and shape of the device hole 193 are set to correspond to those of the chip-electrode-pad forming region of the LSI chip 192. In the package film 191, the external electrode pads 5 are formed on the inner-lead forming surface side, and the inner-lead forming surface is used as the external connection surface 191A. Meanwhile, the resin surface of the package film 191 is used as a device mounting surface 191B which is the side where the LSI chip 191 is mounted.

Next, as shown in FIG. 19C, in the same procedure as that of the above-described first embodiment, the inner leads 3 are collectively bonded to the chip electrode pads 192a of the LSI chip 192, the LSI chip 192 is mounted on the device mounting surface 191B side of the package film 191 (however, there is no step for bending the package film), and the solder balls 11 are deposited on the external electrode pads 5.

Thus, in accordance with the 19th embodiment, since the LSI chip 192 in which the chip electrode pads 192a are formed on the central portion of the chip is mounted on the package film 191 having the device hole 193 at a position corresponding to the chip-electrode-pad forming region and having substantially the same size as that of the LSI chip 192, a special elastic adhesive and a substrate whose coefficient of thermal expansion differs from that of the LSI chip are not used, and it is possible to improve the reliability of the semiconductor device. In addition, it is possible to reduce the number of processing steps (the number of bending steps of the package film) and reduce the material cost, thereby making it possible to further lower the cost of the semiconductor device. Moreover, a more compact and lightweight semiconductor device can be realized as compared with the above-described first embodiment.

It should be noted that the inner leads may be bonded directly to the chip electrode pads as in the above-described third embodiment. Furthermore, it is possible to adopt the structure in which the solder balls 11 are not deposited on the external electrode pads 5.

Figure 20:
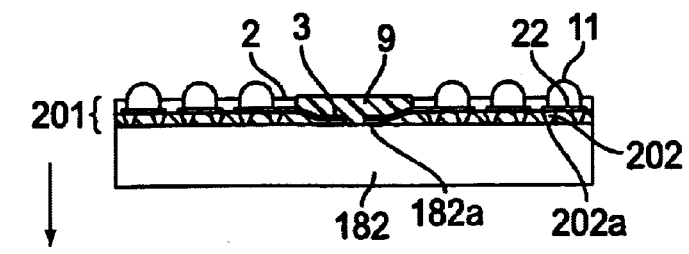
FIG. 20 is a cross-sectional structural diagram of a semiconductor device in accordance with a 20th embodiment of the present invention.

A 20th embodiment of the present invention is characterized in that a package film having insulating resin projections on the device mounting surface is used in the above-described 18th or 19th embodiment. FIG. 20 is a cross-sectional view illustrating the structure of a semiconductor device in accordance with the 20th embodiment of the present invention. Incidentally, in FIG. 20, those parts and portions which are identical to those shown in FIGS. 1 to 19 are denoted by the same reference numerals.

The semiconductor device shown in FIG. 20 is arranged such that not the package film 181 but a package film 201 having insulating resin projections on the device mounting surface is used in the semiconductor device in accordance with the 18th embodiment. Insulating resin projections 202 are provided on a device mounting surface 201B of the package film 201. These insulating resin projections 202 can be easily formed by coating the base resin 2 with the inner leads 3 patterned thereon with an insulating resin, and by subjecting this insulating resin to photolithographic etching.

Next, in the same procedure as that of the above-described 18th embodiment, the inner leads 3 are bonded to the chip electrode pads 182a of the LSI chip 182, and the encapsulating resin 9 is allowed to flow into the space between the surface of the LSI chip 182 and the package film 201, thereby fixing and mounting the LSI chip 182. At this time, the encapsulating resin 9 is allowed to flow in by arranging the package film 201 and the LSI chip 182 such that top portions 202a of the insulating resin projections 202 abut against the surface of the LSI chip 182. In addition, the insulating resin projections 202 have the function of making the encapsulating resin 9 to flow and of improving the flatness of the package film 201.

Thus, in accordance with the 20th embodiment, since the insulating resin projections 202 are provided on the device mounting surface 201B of the package film 201, the flow of the encapsulating resin 9 is facilitated, and it is possible to improve the flatness of the package film 201, thereby making it possible to improve the quality of the package.

Incidentally, it goes without saying that this 20th embodiment is also applicable to the above-described 19th embodiment. In addition, it is possible to adopt the structure in which the solder balls 11 are not deposited on the external electrode pads 5.

Figure 21A:
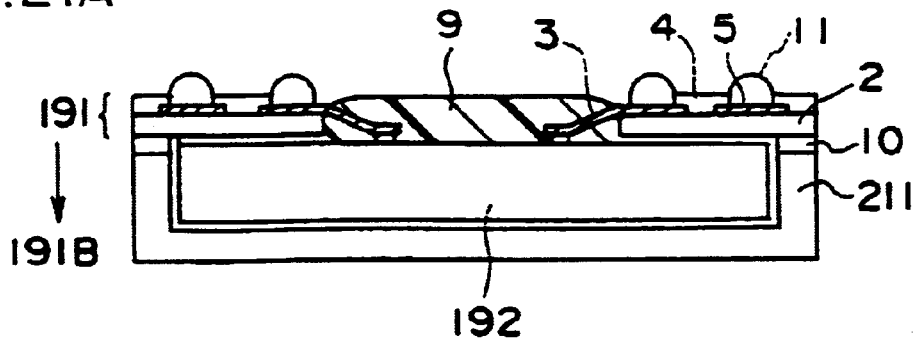
FIG. 21A is a cross-sectional structural diagram of a semiconductor device in accordance with a 21st embodiment of the present invention in which the semiconductor device in the 19th embodiment of the present invention is provided with the box-shaped protective frame.
Figure 21B:
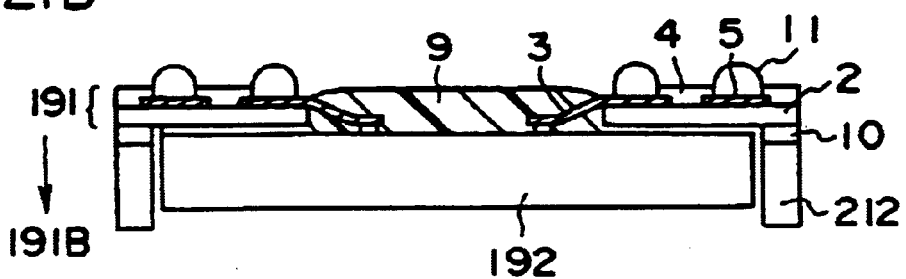
FIG. 21B is a cross-sectional structural diagram of the semiconductor device in accordance with the 21st embodiment of the present invention in which the semiconductor device in the 19th embodiment of the present invention is provided with the bottomless protective frame.

A 21st embodiment of the present invention is characterized in that the semiconductor device using a package film having a device hole formed in a region along its central portion or its center line is provided with a protective frame for protecting the side surfaces and the reverse surface of the LSI chip. FIGS. 21A and 21B are cross-sectional structural views illustrating a semiconductor device in accordance with the 21st embodiment of the present invention. Incidentally, in FIGS. 21A and 21B, those parts and portions which are identical to those shown in FIGS. 1 to 20 are denoted by the same reference numerals.

The semiconductor device in accordance with the 21st embodiment is arranged such that the semiconductor device in accordance with the above-described 19th embodiment is provided with a box-shaped protective frame 211 shown in FIG. 21A or a bottomless protective frame 212 shown in FIG. 21B. These protective frames 211 and 212 are fixed to the device mounting surface 191B of the package film 191 by using the adhesive 10.

Thus, in accordance with the 21st embodiment, since the protective frame 211 or 212 is provided, the side surfaces and the reverse surface of the LSI chip 192 can be protected, with the result that it is possible to prevent the occurrence of the breakage of the side surfaces and the reverse surface of the LSI chip 192 during its handling, and an improvement in the yield during mounting can be expected.

Incidentally, it goes without saying that this 21st embodiment is also applicable to the above-described 18th or 20th embodiment. In addition, it is possible to adopt the structure in which the solder balls 11 are not deposited on the external electrode pads 5.

Figure 22:
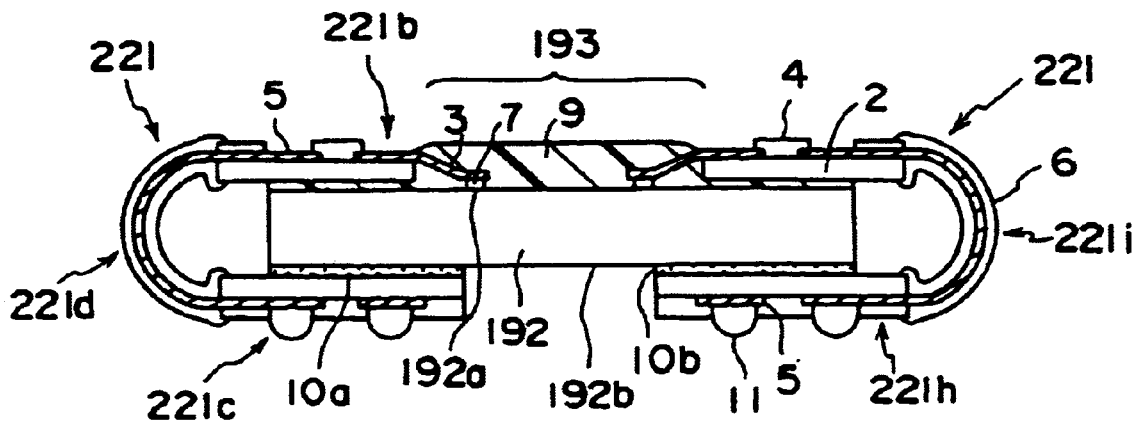
FIG. 22 is a cross-sectional structural diagram of a semiconductor device in accordance with a 22nd embodiment of the present invention.

FIG. 22 is a cross-sectional structural diagram illustrating a semiconductor device in accordance a 22nd embodiment of the present invention. Incidentally, in FIG. 22, those parts and portions which are identical to those shown in FIGS. 1 to 21 are denoted by the same reference numerals.

The semiconductor device shown in FIG. 22 is comprised of a package film 221 and the LSI chip 192 used in the above-described 19th embodiment. The package film 221 is arranged such that four external-connection film portions including external-connection film portions 221c and 221h are provided on the four sides of a device-mounting film portion 221b via four bending portions including bending portions 221d and 221i as in the case of the package film 151 (see FIG. 15A) in accordance with the above-described 15th embodiment.

First, the package film 221 is fabricated. Namely, in the same procedure as that of the above-described first embodiment, the inner leads 3 are formed by effecting patterning on the base resin 2 in which the device hole 193 has been formed in its central portion in correspondence with the chip-electrode-pad forming region of the LSI chip 192 and a bending hole has been formed in the shape of a frame in such a manner as to surround the device hole 193. Then, the insulating resin 4 is formed by effecting patterning thereon, thereby forming the external electrode pads 5. The external electrode pads 5 are formed also on the inner-lead forming surface (first surface) of the device-mounting film portion 221b. The device-mounting film portion 221b has the same structure as that of the package film 191 in accordance with the above-described 19th embodiment (see FIG. 19A), and the package film 221 has the structure in which four external-connection film portions are provided in the package film 191 in accordance with the above-described 19th embodiment (however, the device hole 193 in the device-mounting film portion 221b is illustrated as the device hole 193 in the package film 191 which has been rotated 45°). Incidentally, the elastic resin 6 should preferably be coated to prevent the deterioration of the strength of the inner leads 3 in the four bending portions. The package film 221 is fabricated in the above-described manner.

Next, in the same way as in the above-described 19th embodiment, the LSI chip 192 is mounted on the device-mounting film portion 221b in a state in which the base resin surface (second surface) of the device-mounting film portion 221b faces the surface of the LSI chip 192. Namely, the inner leads 3 are collectively bonded by thermo-compression bonding to the chip electrode pads 192a of the LSI chip 192 on which the bumps 7 have been formed. Then, the encapsulating resin 9 is allowed to flow into the space formed by the device-mounting film portion 221b and the surface of the LSI chip 192, thereby fixing and mounting the LSI chip 192 on the device-mounting film portion 221b.

Next, the four external-connection film portions (the external-connection film portions 221c, 221h, etc.) are respectively bent 180° at the four bending portions (bending portions 221d, 221j, etc.) in such a manner as to be superposed on a reverse surface 192b of the LSI chip 192, and are secured to the reverse surface 192b of the chip by means of the adhesives 10a, 10b, and the like. Finally, the solder balls 11 are respectively deposited on the external electrode pads 5 on the four external-connection film portions. Here, the solder balls 11 are not deposited on the external electrode pads 5 of the device-mounting film portion 221b.

As for the semiconductor device shown in FIG. 22, a plurality of semiconductor devices can be laminated. The number of the semiconductor devices to be laminated is assumed to be N (N is an integer equal to or greater than 2). The external-connection film portions of a first semiconductor device and the device-mounting film portion 221b of a second semiconductor device are made to face each other, and the two semiconductor devices are laminated in such a manner that the respective external electrode pads 5 are superposed on each other. Then, the solder balls 11 deposited on the external electrode pads 5 of the first semiconductor device are melted to electrically connect the superposed external electrodes. As a result, the second semiconductor device is laminated and fixed on the first semiconductor device. Similarly, third to Nth semiconductor devices are laminated. The melting of the solder balls 11 may be effected collectively after the N semiconductor devices have been superposed one on top of another. However, in the case where the external-connection film portions of the first semiconductor device and the device-mounting film portion 221b of the second semiconductor device are made to face each other in the above-described manner, it is necessary to form the external electrode pads 5 of the external-connection film portions in such a manner as to correspond to the positions where the external electrode pads 5 of the device-mounting film portion 221b are formed. Incidentally, the semiconductor devices may be laminated in a state in which the device-mounting film portions 221b or the external-connection film portions of the respective semiconductor devices are made to face each other. It goes without saying that a plurality of the semiconductor devices shown in FIG. 22 can be laminated and mounted on a mother board in the same procedure as the one described above.

Thus, in accordance with the 22nd embodiment, since the external electrode pads 5 are also provided on the device-mounting film portion 221b, and the external-connection film portions are fixed to the reverse surface of the LSI chip, it is possible to reduce the wiring length, protect the reverse surface of the LSI chip, and flatten the external-connection film portions, and the laminated mounting on the mother board (three-dimensional mounting) becomes possible. Hence, it becomes possible to reduce the mounting space in the mother board. Further, it is possible to lower the cost of the semiconductor devices and improve the reliability.

It should be noted that two external-connection film portions may be provided on both sides of the device-mounting film portion 221b as in the case of the above-described ninth embodiment. In addition, the solder balls 11 may be deposited only on the device-mounting film portion. Further, the solder balls 11 may or may not be deposited on both the external-connection film portions and the device-mounting film portion. Moreover, the inner leads may be bonded directly to the chip electrode pads as in the case of the above-described third embodiment. Additionally, insulating resin projections such as those of the above-described 20th embodiment may be provided on a second surface of the device-mounting film portion 221b.

Figure 23:
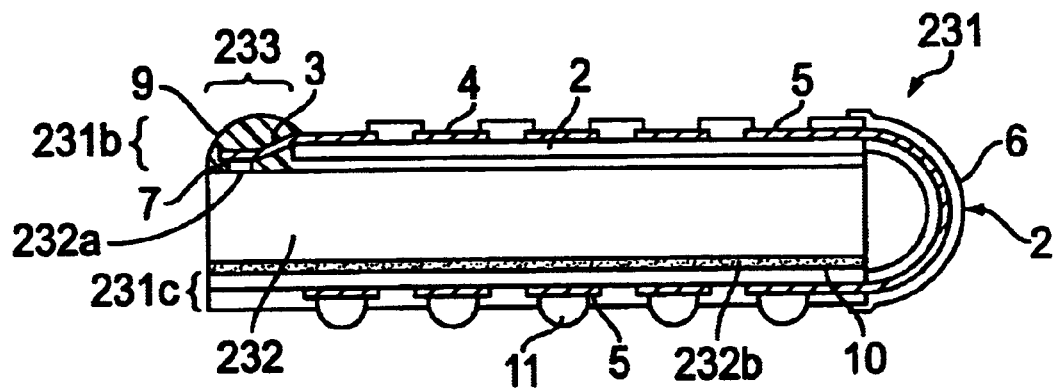
FIG. 23 is a cross-sectional structural diagram of a semiconductor device in accordance with a 23rd embodiment of the present invention.
Figure 24:
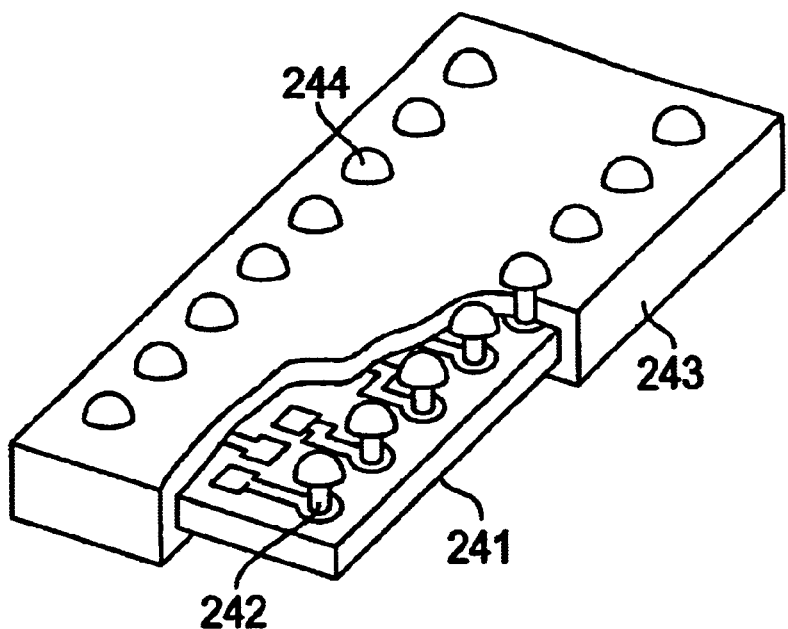
FIG. 24 is a fragmentary perspective view of a semiconductor device having a package of the conventional molded type.
Figure 25:
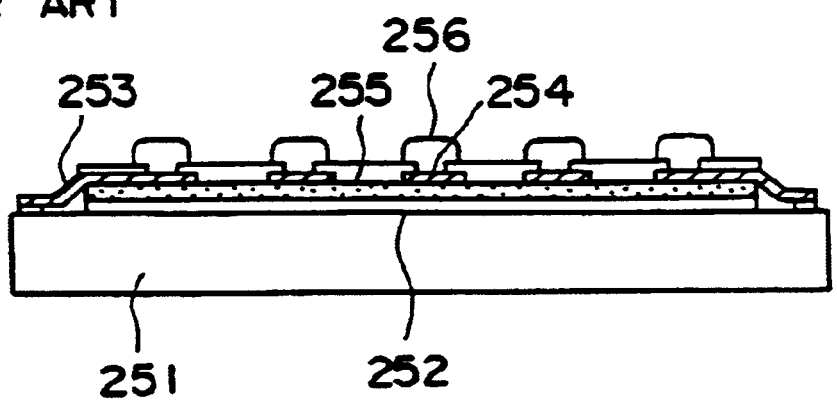
FIG. 25 is a cross-sectional structural diagram of a semiconductor device having a package of the conventional film type.
Figure 26:
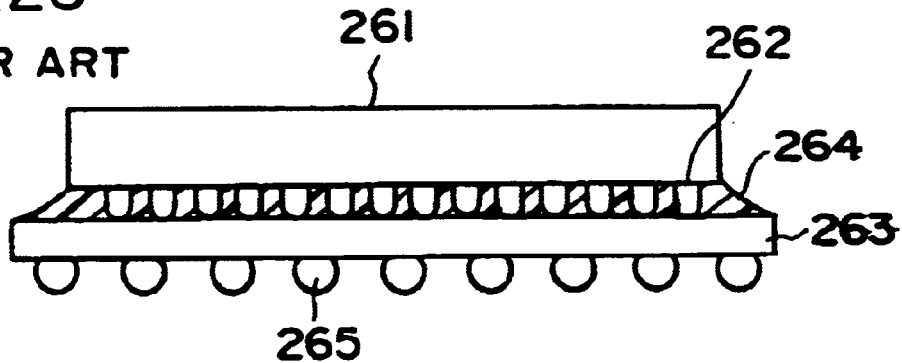
FIG. 26 is a cross-sectional structural diagram of a semiconductor device having a package of the conventional flip chip bonding type.

FIG. 23 shows a cross-sectional structural diagram illustrating a semiconductor device in accordance with a 23rd embodiment of the present invention. Incidentally, in FIG. 23, those parts and portions which are identical to those shown in FIGS. 1 to 22 are denoted by the same reference numerals.

The semiconductor device shown in FIG. 23 is comprised of a package film 231 and an LSI chip 232 in which chip electrode pads 232a are formed in a peripheral portion of the chip surface. The package film 231 is comprised of a device-mounting film portion 231b, an external-connection film portion 231c, and a bending portion 231d located therebetween.

First, the package film 231 is fabricated. Namely, in the same procedure as that of the above-described first embodiment, the inner leads 3 are formed by effecting patterning on the base resin 2 in which a device hole 233 has been formed in its peripheral portion in correspondence with the chip-electrode-pad forming region of the LSI chip 232 and a bending hole has been formed. Then, the insulating resin 4 is formed by effecting patterning thereon, thereby forming the external electrode pads 5. The external electrode pads 5 are formed also on the inner-lead forming surface of the device-mounting film portion 231b. Although the device hole 233 is not a hole as such, but a notched portion provided in the peripheral portion. However, since its function is identical to that of the device hole 183 in accordance with the above-described 18th embodiment, it is referred to as the "hole." Incidentally, the elastic resin 6 should preferably be coated to prevent the deterioration of the strength of the inner leads 3 in the bending portion. The package film 231 is fabricated in the above-described manner.

Next, in the same way as in the above-described 19th embodiment, the LSI chip 232 is mounted on the device-mounting film portion 231b in a state in which the base resin surface of the device-mounting film portion 231b faces the surface of the LSI chip 232. Namely, the inner leads 3 are collectively bonded by thermo-compression bonding to the chip electrode pads 232a of the LSI chip 232 on which the bumps 7 have been formed. Then, the encapsulating resin 9 is allowed to flow into the space formed by the device-mounting film portion 231b and the surface of the LSI chip 232, thereby fixing and mounting the LSI chip 232 on the device-mounting film portion 231b.

Next, the external-connection film portion 231c is bent 180° at the bending portion 231d in such a manner as to be superposed on a reverse surface 232b of the LSI chip 232, and is secured to the reverse surface 232b of the chip by means of the adhesive 10. Finally, the solder balls 11 are deposited on the external electrode pads 5 on the external-connection film portion 231c. Here, the solder balls 11 are not deposited on the external electrode pads 5 of the device-mounting film portion 231b.

As for the semiconductor device shown in FIG. 23, a plurality of semiconductor devices can also be laminated in the same way as in the above-described 22nd embodiment. Accordingly, a plurality of the semiconductor devices shown in FIG. 22 can be laminated and mounted on a mother board.

Thus, in accordance with the 23rd embodiment, since the external electrode pads 5 are also provided on the device-mounting film portion 231b, and the external-connection film portion 231c is fixed to the reverse surface of the LSI chip, it is possible to reduce the wiring length, protect the reverse surface of the LSI chip, and flatten the external-connection film portion, and the laminated mounting on the mother board (three-dimensional mounting) becomes possible. Hence, it becomes possible to reduce the mounting space in the mother board. Further, since one external-connection film portion is used, it is possible to improve the positional accuracy of the external electrode pads 5 as compared with the above-described 22nd embodiment.

It should be noted that the solder balls 11 may be deposited only on the device-mounting film portion 231d. Further, the solder balls 11 may or may not be deposited on both the external-connection film portion 231c and the device-mounting film portion 231b. Moreover, the inner leads may be bonded directly to the chip electrode pads as in the case of the above-described third embodiment. In addition, a plurality of external-connection film portions may be provided. Further, insulating resin projections such as those of the above-described 20th embodiment may be provided on the second surface of the device-mounting film portion 231b. Still further, it is possible to adopt a structure in which the external-connection film portion and the bending portion are not provided as in the case of the above-described 18th or 19th embodiment.

Figure 27A:
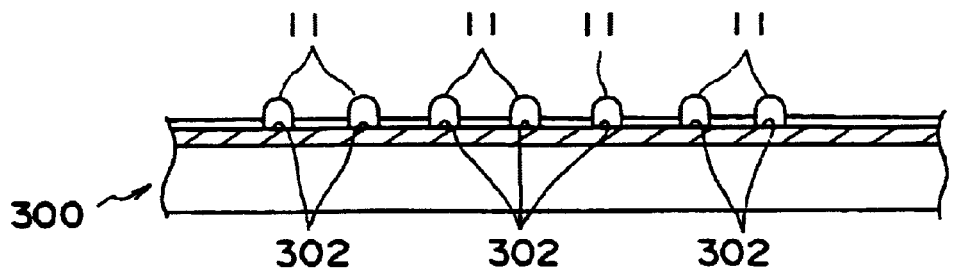
FIG. 27A is a schematic cross-sectional view of an essential portion of a mother board used in the mounting of a semiconductor device in accordance with the present invention on a mother board.
Figure 27B:
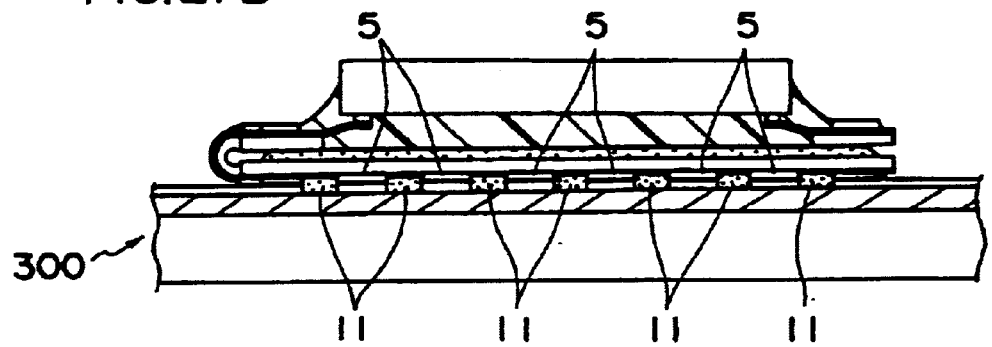
FIG. 27B is a cross-sectional structural diagram illustrating the mounting of a semiconductor device in accordance with the present invention on a mother board.

It should be noted that the mounting of the semiconductor device on the mother board is effected as described below. Referring to FIGS. 27A and 27B, a description will be given by citing as an example the semiconductor device in accordance with the first embodiment.

FIG. 27A shows a schematic cross-sectional view of a mother board 300 on which the semiconductor device in accordance with the first embodiment is mounted. First, prior to the mounting of the semiconductor device, the solder balls 11 are deposited on electrode pads 302 of the mother board 300. Next, the semiconductor device is placed on the mother board 300. At that time, the semiconductor device is placed in such a way that the electrode pads 302 of the mother board 300 correspond to the external electrode pads 5 of the semiconductor device. Finally, the solder balls 11 are melted to electrically connect the mother board 300 and the semiconductor device.

Since the solder balls 11 are deposited on the mother board 300, it becomes possible to mount a plurality of packages simultaneously. Hence, there is an advantage in that the number of steps of mounting the semiconductor devices on the mother board 300 can be reduced. In addition, since the step for depositing the solder balls 11 on the external electrode pads 302 becomes unnecessary in the process for manufacturing the semiconductor device, there is an advantage in that the number of processing steps can be reduced, and it is possible to further lower the cost of the packages.

Figure 28:
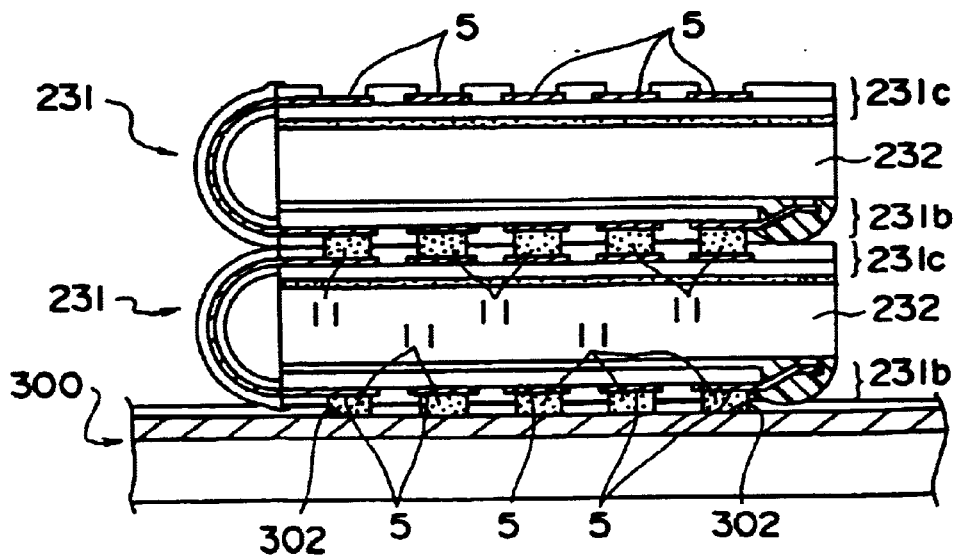
FIG. 28 is a cross-sectional structural diagram in which a plurality of semiconductor devices in accordance with the present invention are laminated and mounted on a mother board.

Further, in the 22nd and 23rd embodiments, in the case where a plurality of semiconductor devices are laminated and mounted on the mother board 300, the procedure described below is taken. Referring to FIG. 28, a description will be given by citing the semiconductor device of the 23rd embodiment as an example.

FIG. 28 shows a state in which two semiconductor devices are placed on the mother board 300 in a superposed manner, and are electrically connected. To laminate such a plurality of semiconductor devices, first, the external electrode pads formed on either the external-connection film portion or the device-mounting film portion of the first semiconductor device are superposed on the electrode pads 302 of the mother board 300, and the external electrode pads formed on either the external-connection film portion or the device-mounting film portion of the second semiconductor device are superposed on the external electrode pads formed on another film portion of the first semiconductor device, such that the superposed electrodes are electrically connected. It should be noted that the electrical connection is established as the solder balls 11 are deposited in advance on the mother board 300 and the semiconductor devices between the superposed electrodes, and the solder balls 11 are then melted.

In accordance with the above-described method, an advantage can be obtained in that since a plurality of semiconductor devices are laminated and mounted, the mounting space on the mother board can be saved.

What is claimed:

1. A semiconductor device comprising:

a semiconductor chip having a surface, on which an element is formed, and an edge;

a plurality of electrodes arranged in at least two lines on the surface of said semiconductor chip;

a base resin film fixed on the surface of said semiconductor chip via an insulating film, the base resin film having a first surface facing said semiconductor chip and a second surface opposite the first surface, and a device hole that exposes the plurality of electrodes;

a plurality of conductors provided on the first surface of said base resin film, the plurality of conductors extending into the device hole and connecting to said plurality of electrodes; and electrode pad holes which expose the plurality of conductors, the electrode pad holes being disposed between the device hole and the edge of the semiconductor chip, wherein said plurality of conductors are divided into first and second groups of conductors, the conductors included in the first group being connected to and disposed near the electrodes of one of the at least two lines of electrodes, and the conductors included in the second being connected to and disposed near the electrodes of the other at least two lines of electrodes.

2. A semiconductor device according to claim 1, further comprising solder balls connecting to the conductors, said solder balls being disposed in the electrode pad holes.

3. The semiconductor device according to claim 2, further comprising a sealing resin for sealing said device hole.

4. The semiconductor device according to claim 1, further comprising a sealing resin for sealing said device hole.

5. A semiconductor device comprising:

a semiconductor chip having a surface, on which an element is formed, and an edge;

a plurality of electrodes arranged in at least two lines on the surface of said semiconductor chip;

a base resin film fixed on the surface of said semiconductor chip via an insulating film, the base resin film having a first surface facing said semiconductor chip and a second surface opposite the first surface, and a device hole that entirely exposes the plurality of electrodes;

a plurality of conductors provided on the first surface of said base resin film, the plurality of conductors extending into the device hole and connecting to said plurality of electrodes; and electrode pad holes, which exposes the plurality of conductors, the electrode pad holes being disposed between the device hole and the edge of the semiconductor chip, wherein the insulating film is disposed so as to not extend past the edges of the base resin film into the exposed area of the device hole.

6. The semiconductor device according to claim 5, further comprising solder balls connecting to the conductors, said solder balls being disposed in the electrode pad holes.

7. The semiconductor device according to claim 6, further comprising a sealing resin for sealing said device hole.

8. The semiconductor device according to claim 5, further comprising a sealing resin for sealing said device hole.

9. A semiconductor device comprising:

a semiconductor chip having a surface, on which an element is formed, and an edge;

a plurality of electrodes arranged in at least two lines on the surface of said semiconductor chip;

a base resin film fixed on the surface of said semiconductor chip via an insulating film, the base resin film having a first surface facing said semiconductor chip and a second surface opposite the first surface, and a device hole that exposes the plurality of electrodes;

a plurality of conductors provided on the first surface of said base resin film, the plurality of conductors extending into the device hole and connecting to said plurality of electrodes; and electrode pad holes, which exposes the plurality of conductors, the electrode pad holes being disposed between the device hole and the edge of the semiconductor chip, wherein said electrode pad holes are disposed in a staggered manner.

10. The semiconductor device according to claim 9, further comprising solder balls connecting to the conductors, said solder balls being disposed in the electrode pad holes.

11. The semiconductor device according to claim 10, further comprising a sealing resin for sealing said device hole.

12. The semiconductor device according to claim 9, further comprising a sealing resin for sealing said device hole.

* * * * *

UNITED STATES PATENT AND TRADEMARK OFFICE
CERTIFICATE OF CORRECTION

PATENT NO. : 6,710,437 B2
DATED : March 23, 2004
INVENTOR(S) : Takahashi et al.

It is certified that error appears in the above-identified patent and that said Letters Patent is hereby corrected as shown below:

Title page,
Item [62], Related U.S. Application Data, following "Pat. No. 6,589,817", please insert the following -- which is a Divisional of application no. 08/944,891, filed on October 6, 1997, now U.S. Pat. No. 6,246,114. --

Signed and Sealed this

Twenty-sixth Day of April, 2005

JON W. DUDAS
*Director of the United States Patent and Trademark Office*